US012593623B2

(12) United States Patent
Chang et al.

(10) Patent No.: US 12,593,623 B2
(45) Date of Patent: Mar. 31, 2026

(54) RRAM WITH A BARRIER LAYER

(71) Applicant: Taiwan Semiconductor Manufacturing Company, Ltd., Hsin-Chu (TW)

(72) Inventors: Fu-Chen Chang, New Taipei (TW); Kuo-Chi Tu, Hsin-Chu (TW); Wen-Ting Chu, Kaohsiung (TW); Chu-Jie Huang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 421 days.

(21) Appl. No.: 18/182,438

(22) Filed: Mar. 13, 2023

(65) Prior Publication Data
US 2023/0217842 A1 Jul. 6, 2023

Related U.S. Application Data

(60) Continuation of application No. 17/171,278, filed on Feb. 9, 2021, now Pat. No. 11,611,038, which is a
(Continued)

(51) Int. Cl.
*H10N 70/20* (2023.01)
*H10B 63/00* (2023.01)
*H10N 70/00* (2023.01)

(52) U.S. Cl.
CPC .......... *H10N 70/245* (2023.02); *H10B 63/30* (2023.02); *H10B 63/80* (2023.02); *H10N 70/041* (2023.02);
(Continued)

(58) Field of Classification Search
CPC .. H10N 70/066; H10N 70/245; H10N 70/826; H10N 70/8416; H10B 63/80
(Continued)

(56) References Cited

U.S. PATENT DOCUMENTS 9,595,564 B1 3/2017 Kedo
9,793,323 B1 10/2017 Lung et al.
(Continued)

FOREIGN PATENT DOCUMENTS

CN 107591479 A * 1/2018 .......... H01L 21/762
KR 20170070830 A * 6/2017 .......... H10N 70/801

OTHER PUBLICATIONS

Chen et al. "Endurance/Retention Trade-off on HfO2/Metal Cap 1T1R Bipolar RRAM." IEEE Transactions On Electron Devices, vol. 60, No. 3, Mar. 2013.
(Continued)

*Primary Examiner* — Phuc T Dang
(74) *Attorney, Agent, or Firm* — Eschweiler & Potashnik, LLC

(57) ABSTRACT
Various embodiments of the present application are directed towards a resistive random-access memory (RRAM) cell comprising a barrier layer to constrain the movement of metal cations during operation of the RRAM cell. In some embodiments, the RRAM cell further comprises a bottom electrode, a top electrode, a switching layer, and an active metal layer. The switching layer, the barrier layer, and the active metal layer are stacked between the bottom and top electrodes, and the barrier layer is between the switching and active metal layers. The barrier layer is conductive and between has a lattice constant less than that of the active metal layer.

20 Claims, 13 Drawing Sheets

Related U.S. Application Data division of application No. 16/434,414, filed on Jun. 7, 2019, now Pat. No. 10,950,784.

(52) U.S. Cl.
CPC ......... *H10N 70/066* (2023.02); *H10N 70/826* (2023.02); *H10N 70/8416* (2023.02)

(58) Field of Classification Search
USPC .............................................................. 257/3
See application file for complete search history.

(56) References Cited

U.S. PATENT DOCUMENTS

| | | | |
|---|---|---|---|
| 10,176,866 B1 * | 1/2019 | Trinh ................. | G11C 13/0007 |
| 10,573,811 B2 | 2/2020 | Tseng et al. | |
| 2003/0015742 A1 | 1/2003 | Ogawa et al. | |
| 2003/0209746 A1 | 11/2003 | Horii | |
| 2005/0013000 A1 * | 1/2005 | Uehara ................. | G02F 1/0305 |
| | | | 359/586 |
| 2006/0255884 A1 * | 11/2006 | Tanaka ............... | H03H 9/02842 |
| | | | 333/195 |
| 2008/0054245 A1 * | 3/2008 | Ahn ..................... | H10N 70/826 |
| | | | 257/3 |
| 2008/0142972 A1 | 6/2008 | Redeker et al. | |
| 2012/0068143 A1 | 3/2012 | Smythe et al. | |
| 2014/0268998 A1 * | 9/2014 | Jo ........................ | H10N 70/011 |
| | | | 257/4 |
| 2014/0291669 A1 | 10/2014 | Ji et al. | |
| 2016/0218283 A1 | 7/2016 | Trinh et al. | |
| 2016/0225824 A1 * | 8/2016 | Jo ........................ | H10N 70/883 |
| 2016/0276412 A1 | 9/2016 | Koyama et al. | |
| 2017/0062527 A1 | 3/2017 | Konno | |
| 2017/0279036 A1 | 9/2017 | Mo et al. | |
| 2019/0043795 A1 * | 2/2019 | Chen ................... | H10N 70/063 |
| 2019/0165266 A1 | 5/2019 | Trinh et al. | |
| 2020/0136015 A1 | 4/2020 | Hung et al. | |

OTHER PUBLICATIONS

Wikipedia.org. "Programmable Metallization Cell." Published on Sep. 5, 2018. Retrieved online on Apr. 5, 2019 from https://en.wikipedia.org/wiki/Programmable_metallization_cell.

Chang et al. "Resistance Random Access Memory." Materials Today, vol. 19, Issue 5, Jun. 2016, pp. 254-264.

Non-Final Office Action dated Jun. 30, 2020 for U.S. Appl. No. 16/434,414.

Notice of Allowance dated Oct. 30, 2020 for U.S. Appl. No. 16/434,414.

Ex-Parte Quayle Office Action dated Aug. 22, 2022 for U.S. Appl. No. 17/171,278.

Notice of Allowance dated Nov. 21, 2022 for U.S. Appl. No. 17/171,278.

* cited by examiner

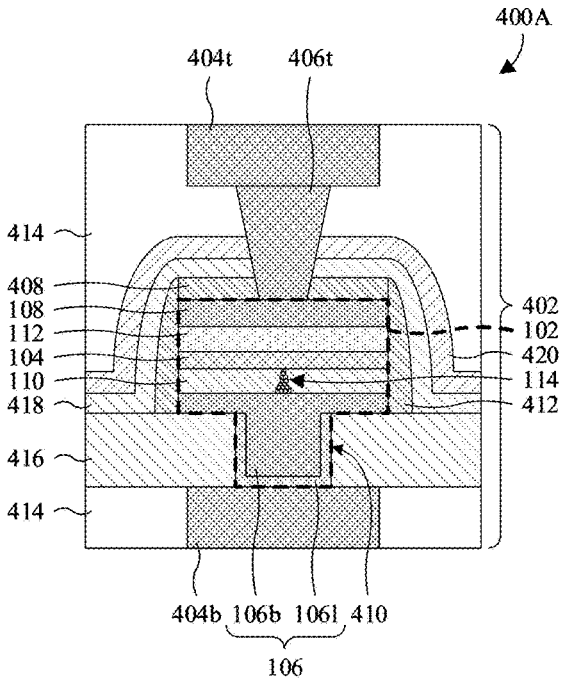
Fig. 4A
Fig. 4B
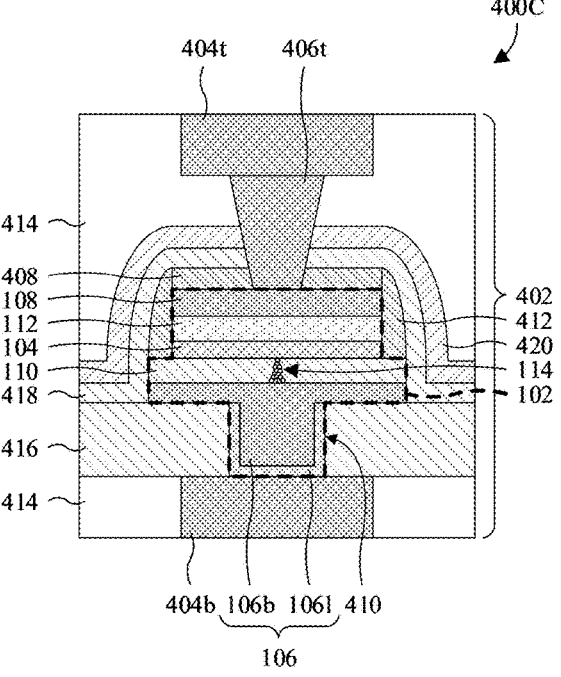
Fig. 4C
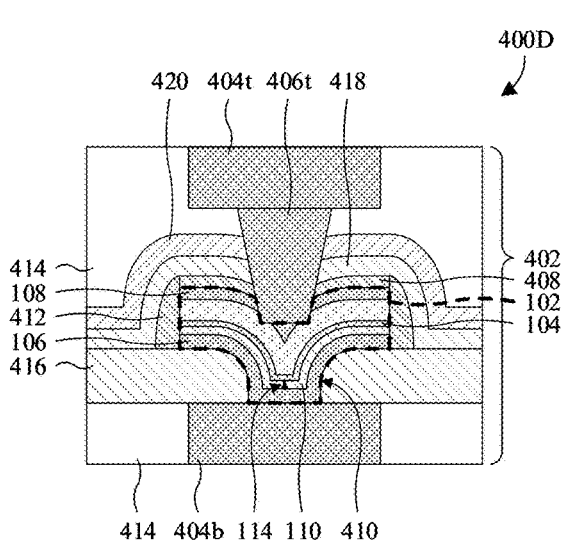
Fig. 4D

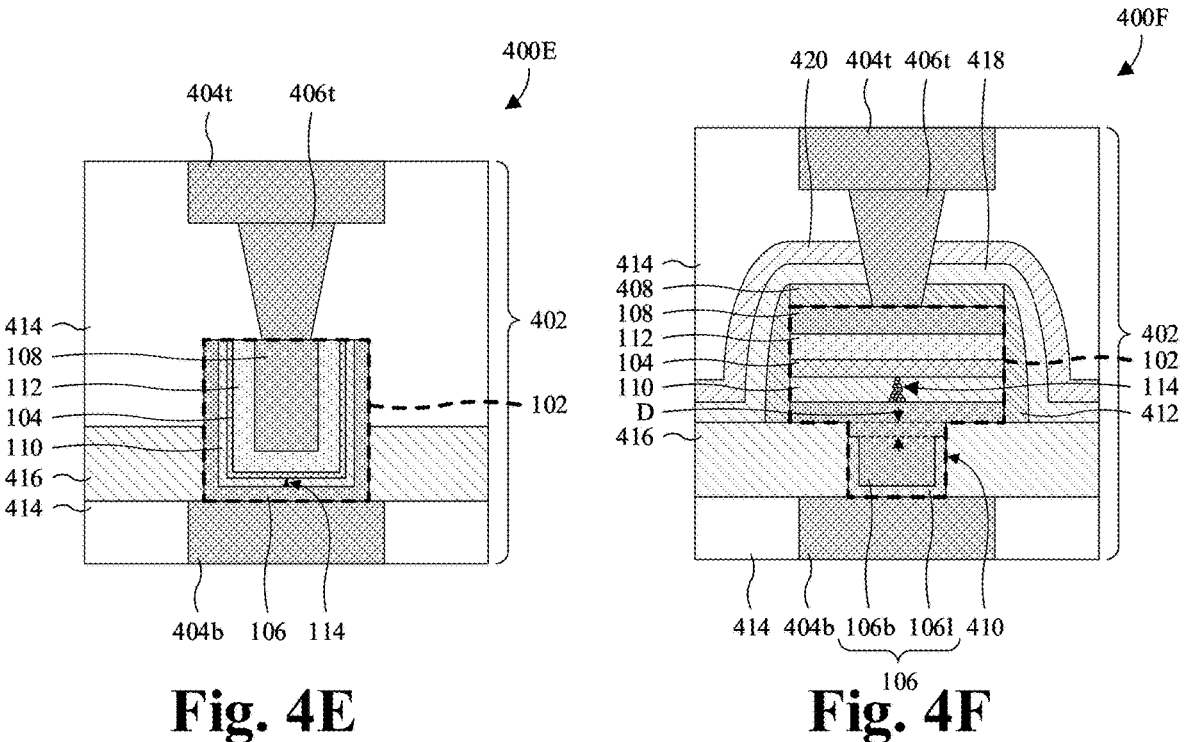
Fig. 4E
Fig. 4F
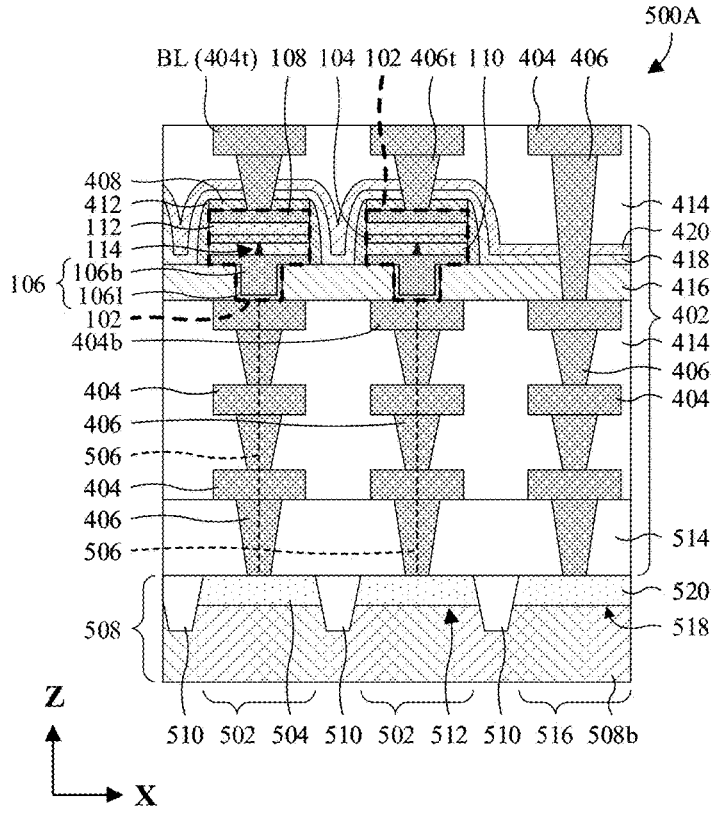
Fig. 5A

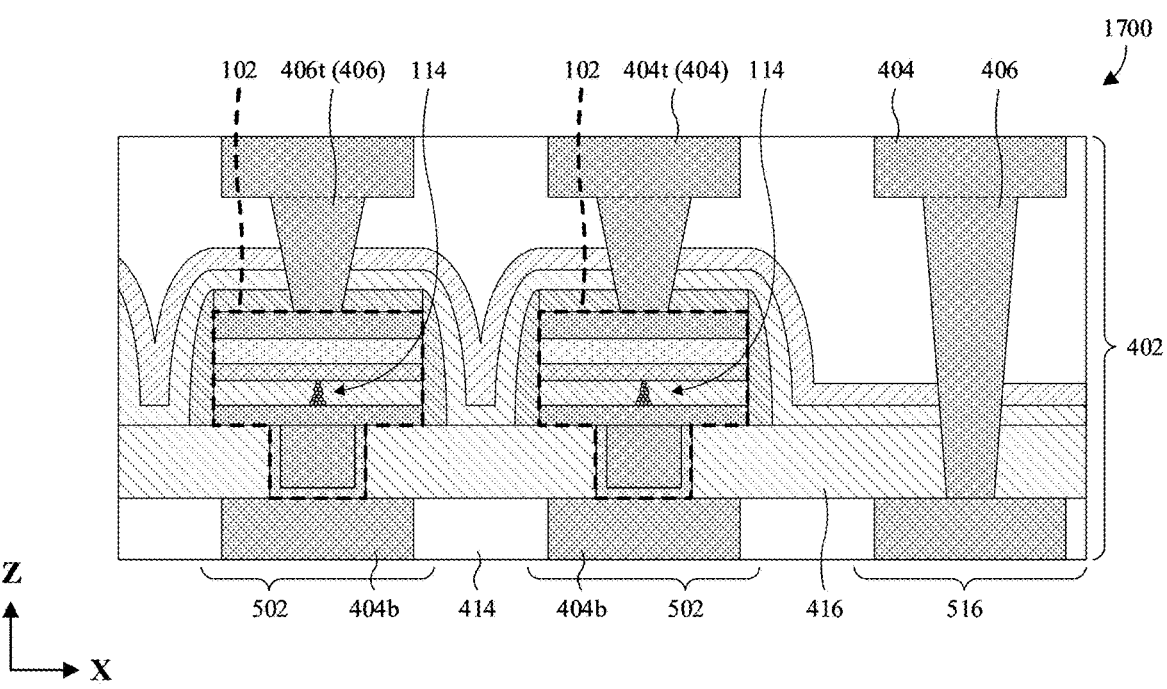

Fig. 17

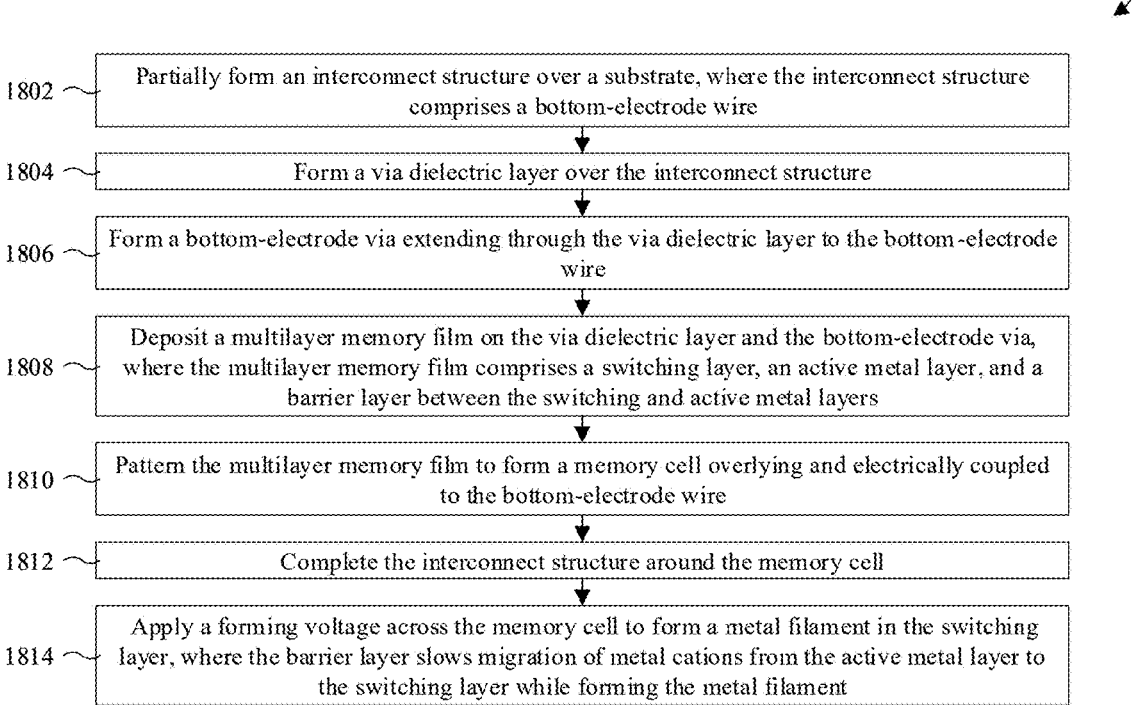

| | |
|---|---|
| 1802 | Partially form an interconnect structure over a substrate, where the interconnect structure comprises a bottom-electrode wire |
| 1804 | Form a via dielectric layer over the interconnect structure |
| 1806 | Form a bottom-electrode via extending through the via dielectric layer to the bottom-electrode wire |
| 1808 | Deposit a multilayer memory film on the via dielectric layer and the bottom-electrode via, where the multilayer memory film comprises a switching layer, an active metal layer, and a barrier layer between the switching and active metal layers |
| 1810 | Pattern the multilayer memory film to form a memory cell overlying and electrically coupled to the bottom-electrode wire |
| 1812 | Complete the interconnect structure around the memory cell |
| 1814 | Apply a forming voltage across the memory cell to form a metal filament in the switching layer, where the barrier layer slows migration of metal cations from the active metal layer to the switching layer while forming the metal filament |

Fig. 18

RRAM WITH A BARRIER LAYER

REFERENCE TO RELATED APPLICATION

This Application is a Continuation of U.S. application Ser. No. 17/171,278, filed on Feb. 9, 2021 (now U.S. Pat. No. 11,611,038, issued on Mar. 21, 2023), which is a Divisional of U.S. application Ser. No. 16/434,414, filed on Jun. 7, 2019 (now U.S. Pat. No. 10,950,784, issued on Mar. 16, 2021). The contents of the above-referenced Patent Applications are hereby incorporated by reference in their entirety.

BACKGROUND

Many modern-day electronic devices include non-volatile memory. Non-volatile memory is electronic memory that is able to store data in the absence of power. Some promising candidates for the next generation of non-volatile memory include resistive random-access memory (RRAM). RRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4F illustrate cross-sectional views of various embodiments of the RRAM cell of FIG. 1 in which the RRAM cell is in an interconnect structure of an integrated circuit chip.

FIGS. 5A and 5B illustrate cross-sectional views of some embodiments of RRAM cells in which the RRAM cells comprise individual barrier layers and are integrated with individual one-transistor one-resistor (1T1R) cells.

FIGS. 7-17 illustrate cross-sectional views of some embodiments of a method for forming RRAM cells comprising individual barrier layers and integrated with 1T1R cells.

FIG. 18 illustrates a block diagram of some embodiments of the method of FIGS. 7-17.

DETAILED DESCRIPTION

Figure 1:
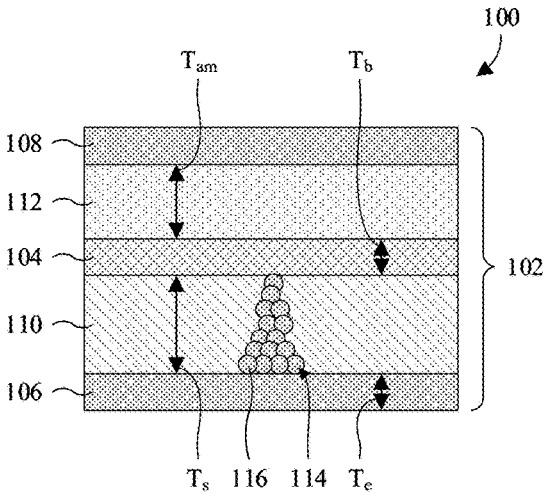
FIG. 1 illustrates a cross-sectional view of some embodiments of a resistive random-access memory (RRAM) cell comprising a barrier layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a resistive random-access memory (RRAM) cell comprises a bottom electrode, a switching layer overlying the bottom electrode, an active metal layer overlying the switching layer, and a top electrode layer overlying the active metal layer. During formation of the RRAM cell, a forming voltage with a positive polarity is applied from the top electrode to the bottom electrode. The forming voltage induces oxidation of metal in the active metal layer and hence leads to metal cations. Further, an electric field from the forming voltage causes the metal cations to migrate towards the bottom electrode. Beginning at the bottom electrode, the metal cations are reduced to gradually grow a metal filament extending from the bottom electrode to the top electrode. During operation of the RRAM cell, a reset voltage with a negative polarity and a set voltage with the positive polarity are applied from the top electrode to the bottom electrode to respectively reset the switching layer to a high resistance state (HRS) and to set the switching layer to a low resistance state (LRS). The reset voltage reverses the aforementioned forming process to partially dissolve the metal filament, whereas the set voltage reforms the metal filament according to the aforementioned forming process.

In at least embodiments in which the active metal layer is or comprises aluminum, endurance may be poor. The resistance difference between the HRS and the LRS will degrade with more and more set/reset cycles until the HRS and LRS are substantially the same. Such degradation results from more metal cations entering the switching layer while transitioning to the LRS than leaving the switching layer while transitioning to the HRS. Over time, this builds up the metal filament and it becomes more and more difficult to transition to the HRS within predefined timing constraints and/or predefined operating voltages. As a result, the HRS and LRS eventually become substantially the same and the RRAM cell eventually fails.

Various embodiments of the present application are directed towards an RRAM cell comprising a barrier layer to constrain the movement of metal cations during operation of the RRAM cell. In some embodiments, the RRAM cell further comprises a bottom electrode, a switching layer, an active metal layer, and a top electrode. The switching layer, the barrier layer, and the active metal layer are stacked between the bottom electrode and the top electrode. The barrier layer overlies the switching layer, and the active metal layer overlies the switching layer. Further, the barrier layer is configured to slow movement of metal ions through the barrier layer, from the active metal layer, while switching from a HRS to a LRS. For example, the barrier layer may have a lattice constant less than that of the active metal layer. As another example, the barrier layer may have a density greater than that of the active metal layer.

By arranging the barrier layer between the switching and active metal layers, switching cycling reliability (i.e., endurance) may be increased. For example, where the active metal layer is or comprises aluminum, a tantalum or tantalum nitride barrier layer may reduce the number of metal cations entering the switching layer while transitioning to the LRS. Other material(s) is/are, however, amenable. By reducing the number of metal cations entering the switching layer, build-up of the metal filament over time is slower and hence switching cycling reliability (i.e., endurance) is increased.

Additionally, by arranging the barrier layer between the switching and the active metal layers, forming, set, and reset voltages may be decreased. For example, where the barrier layer comprises tantalum or titanium nitride and the switching layer comprises nitrogen or oxygen, the tantalum or tantalum nitride may migrate to the switching layer and may react with the nitrogen or oxygen. Other material(s) is/are, however, amenable. The migration and reaction may increase leakage and may hence decrease the forming, set, and reset voltages. For example, the forming voltage may decrease by about 30% or some other suitable percentage. By decreasing the forming, set, and reset voltages, power consumption may be decreased. Further, the number of forming fail bits may be decreased.

With reference to FIG. 1, a cross-sectional view 100 of some embodiments of an RRAM cell 102 comprising a barrier layer 104 is provided. As discussed in greater detail hereafter, the barrier layer 104 constrains movement of metal cations (not shown) during set and reset operations of the RRAM cell 102 to enhance endurance of the RRAM cell 102. The RRAM cell 102 may, for example, be integrated with other devices in an integrated circuit (IC) chip and/or may, for example, be a cation-type RRAM cell or some other suitable type of RRAM cell. Note that cation-type RRAM cells are sometimes referred to as programmable metallization cells (PMCs) or conductive-bridging random-access memory (CBRAM) cells.

A bottom electrode 106, a top electrode 108, a switching layer 110, and an active metal layer 112 are stacked with the barrier layer 104 to define the RRAM cell 102. The switching layer 110 overlies the bottom electrode 106, and the barrier layer 104 overlies the switching layer 110. Further, the active metal layer 112 overlies the barrier layer 104, and the top electrode 108 overlies the active metal layer 112. In some embodiments, the barrier layer 104 is or comprise tantalum or tantalum nitride and the active metal layer 112 is or comprise aluminum. Other materials are, however, amenable. For example, the active metal layer 112 may be copper, silver, or some other suitable metal.

During operation of the RRAM cell 102, a metal filament 114 in the switching layer 110 is repeatedly formed and dissolved. While forming the metal filament 114, the active metal layer 112 oxidizes to form metal cations. Further, the metal cations migrate through the barrier layer 104 to the switching layer 110 and reduce into metal atoms 116 defining the metal filament 114. While dissolving the metal filament 114, the metal filament 114 oxidizes to form metal cations. Further, the metal cations migrate through the barrier layer 104 to the active metal layer 112 and reduce into the active metal layer 112. Forming and dissolving the metal filament 114 may, for example, respectively change the RRAM cell 102 to a LRS and a HRS.

By arranging the barrier layer 104 between the switching and active metal layers 110, 112, switching cycling reliability (i.e., endurance) may be increased. For example, the barrier layer 104 may reduce the number of aluminum cations entering the switching layer 110 while transitioning to the LRS. In other words, the barrier layer 104 slows the rate at which aluminum cations enter the switching layer 110 while transitioning to the LRS (relative to the same RRAM cell without the barrier layer). By reducing the number of metal cations entering the switching layer 110, build-up of the metal filament 114 over time is slower and hence switching cycling reliability (i.e., endurance) is increased. Additionally, by arranging the barrier layer 104 between the switching and the active metal layers 110, 112, forming, set, and reset voltages may be decreased. For example, material from the barrier layer 104 may migrate to the switching layer 110 and may react with the switching layer 110. The migration and reaction may increase leakage and may hence decrease the forming, set, and reset voltages. This, in turn, may decrease power consumption and the number of forming fail bits.

The bottom and top electrodes 106, 108 and the active metal layer 112 are conductive. However, the bottom and top electrodes 106, 108 are electrochemically inert compared to the active metal layer 112. Put another way, the active metal layer 112 is electrochemically active compared to the bottom and top electrodes 106, 108. As a result, the bottom and top electrodes 106, 108 have low reactivity with oxygen compared to the active metal layer 112 and hence depend upon a greater amount of energy to oxidize than the active metal layer 112. For example, the bottom and top electrodes 106, 108 may depend upon 5 or more electron volts (eV) to oxidize, whereas the active metal layer 112 may depend upon 3 or less eV to oxidize. Other eV values are, however, amenable.

In some embodiments, the bottom electrode 106 and the top electrode 108 are or comprise, titanium nitride, tantalum nitride, some other suitable conductive material(s), or any combination of the foregoing. Further, in some embodiments, the bottom electrode 106 and the top electrode 108 are or comprises platinum and/or some other suitable noble metal(s). In some embodiments, the bottom electrode 106 and the top electrode 108 have electrode thicknesses $T_e$ that are about 1-10 nanometers (nm), about 1-5 nm, or about 5-10 nm. Other thicknesses are, however, amenable. In some embodiments, the electrode thicknesses $T_e$ are the same. In other embodiments, the electrode thicknesses $T_e$ are different. In some embodiments, the active metal layer 112 is or comprises aluminum and/or some other suitable metal(s). In some embodiments, the active metal layer 112 has an active-metal thickness $T_{am}$ of about 10-500 nm, about 10-255 nm, or about 255-500 nm. Other thicknesses are, however, amenable. If the active metal layer 112 is too thin (e.g., less than about 10 nm or some other suitable value), the active metal layer 112 may be unable to sufficiently source metal filaments in the switching layer 110. If the active metal layer 112 is too thick (e.g., greater than about 500 nm or some other suitable value), voltage drops across the active metal layer 112 may be high and hence reliability may be poor. Additionally, or alternatively, if the active metal layer 112 is too thick (e.g., greater than about 500 nm or some other suitable value), the active metal layer 112 may make integration with existing processes more difficult.

The switching layer 110 and the barrier layer 104 are respectively dielectric and conductive. Further, the switching layer 110 and the barrier layer 104 are respectively an electrolyte and a barrier for metal cations that result from oxidation of the active metal layer 112. For example, where the active metal layer 112 is or comprises aluminum, the switching layer 110 and the barrier layer 104 are respectively an electrolyte and a barrier for aluminum cations resulting from oxidation of the active metal layer 112.

In some embodiments, the switching layer 110 is or comprises silicon oxide (e.g., SiO2), hafnium oxide (e.g., HfO2), silicon nitride (e.g., SiNx), aluminum oxide (e.g., Al2O3), zirconium oxide (e.g., ZrO2), some other suitable dielectric(s), or any combination of the foregoing. In some embodiments, the switching layer 110 has a switching thickness $T_s$ or about 1-50 nm, about 1-25 nm, or about 25-50 nm. Other thicknesses are, however, amenable.

In some embodiments, the barrier layer 104 has a smaller lattice constant and/or a greater density than the active metal layer 112 so it's more difficult for metal cations from the active metal layer 112 to diffuse or otherwise move through the barrier layer 104. For example, the active metal layer 112 may have a density less than about 5 grams per cubic centimeter (g/cm3) (e.g., about 2.7 g/cm3 or some other suitable value), whereas the barrier layer 104 may have a density greater than about 10 g/cm3 (e.g., about 16.69 g/cm3, about 13.7 g/cm3, or some other suitable value). As another example, the active metal layer 112 may have a lattice constant greater than about 385 (e.g., about 404.95 or some other suitable value), whereas the barrier layer 104 may have a lattice constant less than about 350 (e.g., about 330.13 or some other suitable value). Other density values and lattice constant values are, however, amenable. By making it more difficult to for metal cations to move through the barrier layer 104, the rate at which the metal cations move through the barrier layer 104 is reduced relative to the same RRAM cell without the barrier layer 104. In some embodiments, the barrier layer 104 is or comprises tantalum, tantalum nitride, some other suitable barrier material(s), or any combination of the foregoing.

In some embodiments, the barrier layer 104 has a barrier thickness $T_b$ of about 1-10 nm, about 1-5 nm, or about 5-10 nm. Other thicknesses are, however, amenable. If the barrier layer 104 is too thin (e.g., less than about 1 nm or some other suitable value), the barrier layer 104 may be unable to slow migration of metal cations through the barrier layer 104 and may hence be unable to enhance endurance of the RRAM cell 102. On the other hand, if the barrier layer 104 is too thick (e.g., more than 10 nm or some other suitable value), the barrier layer 104 may completely block or overly slow migration of metal cations through the barrier layer 104, thereby preventing switching between the LRS and the HRS and/or changing operation of the RRAM cell 102. For example, the RRAM cell 102 may change to defect-type RRAM, from cation-type RRAM, and may hence have different electrical and performance characteristics. As another example, a forming voltage may be overly high, thereby increasing power consumption and the likelihood of failure. Additionally, or alternatively, if the barrier layer 104 is too thick (e.g., 10 nm or some other suitable value), the barrier layer 104 may make integration with existing processes more difficult. In some embodiments, a ratio of the barrier thickness $T_b$ to the active-metal thickness $T_{am}$ is about 1:1-500, about 1:1-250, about 1:250-500, or some other suitable ratio. Further, in some embodiments a ratio of the barrier thickness $T_b$ to the switching thickness $T_s$ is about 1:0.1-50, about 1:0.1-25, about 1:0.5-50, or some other suitable ratio. In some embodiments, a total thickness variation (TTV) of the barrier layer 104 is less than about 1 angstrom, 2 angstroms, or some other suitable value. TTV is the difference between a maximum value of the barrier thickness $T_b$ and a minimum value of the barrier thickness $T_b$. If the TTV is too large (e.g., greater than about 2 angstroms or some other suitable value), electric field uniformity across the RRAM cell 102 may be low. This, in turn, may decrease bulk manufacturing yields for the RRAM cell 102 and/or may degrade performance of the RRAM cell 102. Additionally, or alternatively, if the TTV is too large (e.g., greater than about 2 angstroms or some other suitable value), portions of the barrier layer 104 may be too thin (e.g., less than about 1 nm or some other suitable value). As noted above, the barrier layer 104 may be unable to slow migration of metal cations through the barrier layer 104 if the barrier layer 104 is too thin.

Figure 2A:
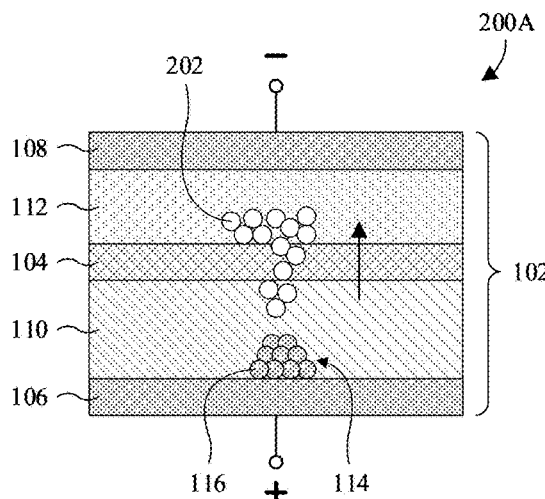
FIGS. 2A and 2B illustrate cross-sectional views of some embodiments of the RRAM cell of FIG. 1 while respectively dissolving a metal filament and forming the metal filament.

With reference to FIG. 2A, a cross-sectional view 200A of some embodiments of the RRAM cell 102 while resetting the RRAM cell 102 to a HRS is provided. A reset voltage with a negative polarity is applied from the top electrode 108 to the bottom electrode 106. For example, a positive voltage is applied to the bottom electrode 106 while the top electrode 108 is grounded. The reset voltage induces oxidation of the metal filament 114, beginning at a top of the metal filament 114 and extending towards a bottom of the metal filament 114. As the oxidation proceeds, metal atoms 116 of the metal filament 114 are converted to metal cations 202. Further, the electric field produced by the reset voltage causes the metal cations 202 to migrate to the active metal layer 112, through the barrier layer 104, and to reduce into metal atoms of the active metal layer 112. Accordingly, the metal filament 114 is dissolved over time, beginning at the barrier layer 104 and extending to the bottom electrode 106.

Figure 2B:
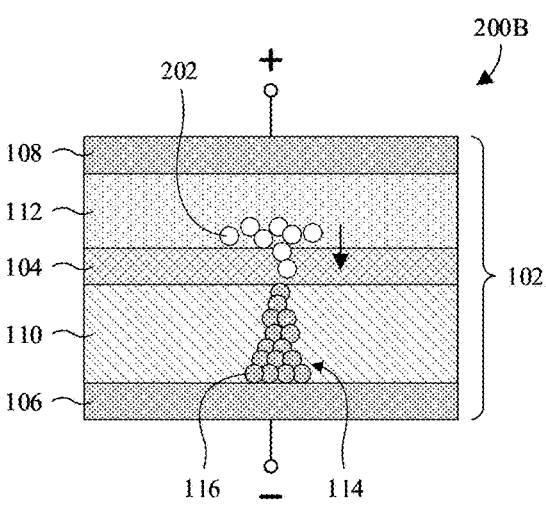

With reference to FIG. 2B, a cross-sectional view 200B of some embodiments of the RRAM cell 102 while setting the RRAM cell to a LRS is provided. A set voltage with a positive polarity is applied from the top electrode 108 to the bottom electrode 106. For example, a positive voltage is applied to the top electrode 108 while the bottom electrode 106 is grounded. The set voltage induces oxidation of the active metal layer 112 and hence converts metal atoms of the active metal layer 112 to metal cations 202. Further, the electric field produced by the set voltage causes the metal cations 202 to migrate towards the bottom electrode 106, through the barrier layer 104, and to reduce into the metal atoms 116 defining the metal filament 114. The metal cations 202 reduce into the metal atoms 116 at a top of the metal filament 114 if present and reduce into the metal atoms 116 at a top of the bottom electrode 106 if the metal filament 114 is not yet present. Accordingly, the metal filament 114 grows over time, beginning at the bottom electrode 106 and extending to the barrier layer 104.

In some embodiments, including the barrier layer 104 reduces the number of metal cations 202 migrating into the switching layer 110, and/or reduces the migration rate into the switching layer 110, during the setting of FIG. 2B. Such embodiments may, for example, arise when the barrier layer 104 is or comprise tantalum or tantalum nitride and the active metal layer 112 is or comprises aluminum. Other materials are, however, amenable. By reducing the number of metal cations 202 migrating into the switching layer 110, the metal filament 114 may be thinner and endurance may be enhanced.

The number of metal cations 202 migrating into the switching layer 110 during the setting of FIG. 2B may be greater than the number of metal cations 202 migrating out of the switching layer 110 during the resetting of FIG. 2A. Over time, this may lead to enlargement of the metal filament 114 in the LRS, whereby it may be become more and more difficult to transition to the HRS within predefined timing constraints and/or predefined operating voltages. Due to this enlarging of the metal filament, the HRS and the LRS eventually converge and the RRAM cell 102 eventually fails. Including the barrier layer 104 reduces the number of metal cations 202 migrating into and out of the switching layer 110, thereby increasing the time before failure and hence increasing endurance of the RRAM cell 102.

Figure 3:
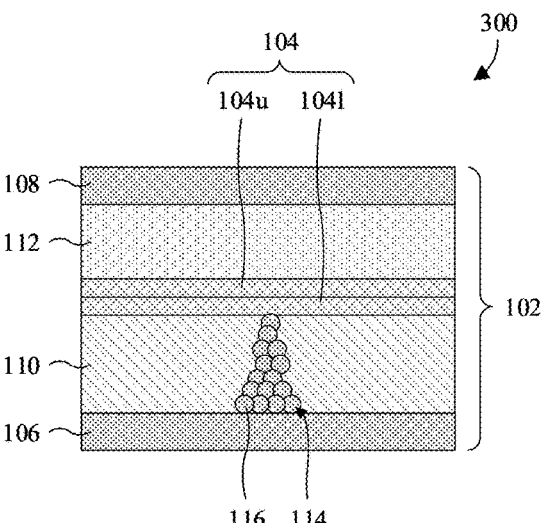
FIG. 3 illustrates a cross-sectional view of some embodiments of the RRAM cell of FIG. 1 in which the barrier layer is a multilayer film.

With reference to FIG. 3, a cross-sectional view 300 of some embodiments of the RRAM cell 102 of FIG. 1 is provided in which the barrier layer 104 is a multilayer film. In some embodiments, the barrier layer 104 comprises a lower barrier layer 104l and an upper barrier layer 104u overlying the lower barrier layer 104l. The lower barrier layer 104l may, for example, be or comprise tantalum, whereas the upper barrier layer 104u may, for example, be or comprise tantalum nitride, or vice versa. Other materials are, however, amenable.

With reference to FIG. 4A, a cross-sectional view 400A of some embodiments of the RRAM cell 102 of FIG. 1 is provided in which the RRAM cell 102 is in an interconnect structure 402 of an integrated circuit chip and the bottom electrode 106 of the RRAM cell 102 has a T-shaped profile. The RRAM cell 102 underlies a top-electrode wire 404t and a top-electrode via 406t and further overlies a bottom-electrode wire 404b.

The top-electrode via 406t extends downward from the top-electrode wire 404t to the top electrode 108. In some embodiments (as illustrated), the top-electrode via 406t extends through a hard mask 408 atop the top electrode 108. In alternative embodiments, the hard mask 408 is omitted. The hard mask 408 may be or comprise, for example, silicon nitride and/or some other suitable dielectric(s). In some embodiments, the top-electrode via 406t and the top-electrode wire 404t are different materials and/or are independent of each other. In alternative embodiments, the top-electrode via 406t and the top-electrode wire 404t are the same material and/or are integrated together. The top-electrode wire 404t, the bottom-electrode wire 404b, and the top-electrode via 406t may be or comprise, for example, copper, aluminum copper, some other suitable metal(s), or any combination of the foregoing.

The bottom electrode 106 protrudes downward to the bottom-electrode wire 404b, thereby defining a bottom-electrode via 410 and electrically coupling the bottom electrode 106 to the bottom-electrode wire 404b. The bottom electrode 106 comprises a bottom-electrode body 106b and a bottom-electrode liner 106l cupping an underside of the bottom-electrode body 106b. In some embodiments, the bottom-electrode liner 106l is an adhesion layer to enhance deposition of a layer from which the bottom-electrode body 106b is formed. Further, in some embodiments, the bottom-electrode liner 106l is a diffusion barrier to prevent material of the bottom-electrode wire 404b from diffusing to the bottom-electrode body 106b. The bottom-electrode liner 106l may be or comprise, for example, tantalum nitride, titanium nitride, tantalum, some other suitable material(s), or any combination of the foregoing. The bottom-electrode body 106b may be or comprise, for example, platinum and/or some other suitable conductive material(s).

In alternative embodiments, the bottom-electrode liner 106l is omitted. In such alternative embodiments, the bottom electrode 106 may be a single conductive material throughout an entirety of the bottom electrode 106. For example, the bottom electrode 106 may be or comprise tantalum nitride, titanium nitride, some other suitable conductive material(s), or any combination of the foregoing. Forming the bottom electrode 106 of a single conductive material improves flatness along a top surface of the bottom electrode 106 when the bottom electrode 106 is formed using a chemical mechanical polish (CMP) since the bottom electrode 106 has a single hardness throughout and hence a single removal rate throughout. This, in turn, improves electric field uniformity across the RRAM cell 102.

A dielectric structure surrounds the RRAM cell 102, as well as the top-electrode wire 404t, the top-electrode via 406t, and the bottom-electrode wire 404b. The dielectric structure comprises the hard mask 408 along a top surface of the top electrode 108 and further comprises a sidewall spacer structure 412 on sidewall(s) of the RRAM cell 102. The sidewall spacer structure 412 is on opposite sides of the RRAM cell 102 and may be or comprise, for example, silicon nitride and/or some other suitable dielectric(s). In some embodiments the hard mask 408 and the sidewall spacer structure 412 are or comprise the same material. Additionally, the dielectric structure comprises a plurality of intermetal dielectric (IMD) layers 414, a via dielectric layer 416, an etch stop layer 418, and an IMD liner 420.

The IMD layers 414 respectively surround the bottom-electrode wire 404b and the top-electrode wire 404t, and the via dielectric layer 416, the etch stop layer 418, and the IMD liner 420 are stacked between the IMD layers 414. The via dielectric layer 416 surrounds the bottom-electrode via 410, between the RRAM cell 102 and the bottom-electrode wire 404b. The etch stop layer 418 covers the via dielectric layer 416 and wraps around a top of the RRAM cell 102 along the sidewall spacer structure 412 and the hard mask 408. The IMD liner 420 lines a top of the etch stop layer 418 and separates the etch stop layer 418 from a neighboring one of the IMD layers 414. The IMD layers 414 may be or comprise, for example, an extreme low k dielectric and/or some other suitable dielectric(s). The etch stop layer 418 and/or the via dielectric layer 416 may be or comprise, for example, silicon carbide and/or some other suitable dielectric(s). The IMD liner 420 may be or comprise, for example, tetraethyl orthosilicate (TEOS) oxide and/or some other suitable dielectric(s).

With reference to FIG. 4B, a cross-sectional view 400B of some alternative embodiments of the RRAM cell 102 of FIG. 4A is provided in which the sidewall spacer structure 412 overlies the barrier layer 104. Further, the sidewall spacer structure 412 lines sidewalls respectively of the active metal layer 112 and the top electrode 108, but not sidewalls respectively of the barrier layer 104, the switching layer 110, and the bottom electrode 106.

With reference to FIG. 4C, a cross-sectional view 400C of some alternative embodiments of the RRAM cell 102 of FIG. 4B is provided in which the sidewall spacer structure 412 further lines sidewall(s) of the barrier layer 104.

With reference to FIG. 4D, a cross-sectional view 400D of some alternative embodiments of the RRAM cell 102 of FIG. 4A is provided in which the RRAM cell 102 is indented at the bottom-electrode via 410 and is without the bottom-electrode liner 106l (see FIG. 4A). In alternative embodiments, the RRAM cell 102 further includes the bottom-electrode liner 106l at the bottom-electrode via 410.

With reference to FIG. 4E, a cross-sectional view 400E of some alternative embodiments of the RRAM cell 102 of FIG. 4A is provided in which the bottom-electrode via 410 is omitted and the RRAM cell 102 is directly on the bottom-electrode wire 404b. Further, the bottom and top electrodes 106, 108, the barrier layer 104, the switching layer 110, and the active metal layer 112 have U-shaped profiles and several features in FIG. 4A are omitted. Amongst these omitted features are the sidewall spacer structure 412, the hard mask 408, the etch stop layer 418, and the IMD liner 420. As seen hereafter, the RRAM cell 102 may be formed with a single photolithography/etching process, thereby reducing costs. In alternative embodiments, the bottom and top electrodes 106, 108, the barrier layer 104, the switching layer 110, and the active metal layer 112 have a V-shaped profile or some other suitable profile.

With reference to FIG. 4F, a cross-sectional view 400F of some alternative embodiments of the RRAM cell 102 of FIG. 4A is provided in which a top surface of the bottom-electrode liner 106l is recessed relative to a top surface of the via dielectric layer 416 by a distance D. As seen hereafter, recessing the top surface of the bottom-electrode liner 106l may allow increased planarity at a top surface of the bottom electrode 106 and hence may allow increased electric field uniformity across the RRAM cell 102.

While FIGS. 4A-4F are illustrated using embodiments of the RRAM cell 102 in FIG. 1, embodiments of the RRAM cell 102 in FIG. 3 may be alternatively be used. That is to say, the barrier layer 104 of FIGS. 4A-4F may be a multi-layer film as illustrated in FIG. 3.

With reference to FIG. 5A, a cross-sectional view 500A of some embodiments of RRAM cells 102 is provided in which the RRAM cells 102 comprise individual barrier layers 104 and are integrated with individual one-transistor one-resistor (1T1R) cells 502 in an integrated circuit chip. The RRAM cells 102 may, for example, each be as their counterpart in FIG. 4A is illustrated and described. The 1T1R cells 502 comprise individual drain regions 504 and individual drain-side conductive paths 506.

The drain regions 504 are doped regions of a substrate 508 and have an opposite doping type as a bulk 508b of the substrate 508. For example, the drain regions 504 may be N-type and the bulk 508b of the substrate 508 may be P type or vice versa. In alternative embodiments, the drain regions 504 are on a well region (not shown) of the substrate 508 and have an opposite doping type as the well region. Further, the drain regions 504 are electrically separated from each other by a trench isolation structure 510 and partially define access transistors 512 (partially shown) used to individually select the RRAM cells 102. The trench isolation structure 510 extends into a top of the substrate 508 and comprises silicon oxide and/or some other suitable dielectric material(s). The trench isolation structure 510 may, for example, be a shallow trench isolation (STI) structure or some other suitable trench isolation structure. The substrate 508 may, for example, be a bulk silicon substrate, a silicon-on-insulator (SOI) substrate, or some other suitable semiconductor substrate.

The drain-side conductive paths 506 electrically couple the drain regions 504 to the bottom electrodes 106 of the RRAM cells 102. Further, the drain-side conductive paths 506 are defined by the interconnect structure 402, which comprises a plurality of wires 404 and a plurality of vias 406. The plurality of wires 404 comprises the top-electrode wires 404t and the bottom-electrode wires 404b. In some embodiments, the top-electrode wires 404t correspond to bit lines BL that are shared by other RRAM cells (not shown). The plurality of vias 406 comprises the top-electrode via

406t, and a level of the vias 406 nearest the substrate 508 is in an interlayer dielectric (ILD) layer 514. The wires 404 and the vias 406 may be or comprise, for example, copper, aluminum, aluminum copper, titanium, tungsten, titanium nitride, some other suitable conductive material(s), or any combination of the foregoing.

A peripheral region 516 to a side of the 1T1R cells 502 accommodates a peripheral device 518 (partially shown). The peripheral device 518 may, for example, be a metal-oxide-semiconductor field-effect transistor (MOSFET) or some other suitable semiconductor device. Further, the peripheral device 518 may, for example, be one of many other peripheral devices (not shown) at the peripheral region 516. The peripheral device 518 comprises a pair of source/drain regions 520 (only one of which is shown) in the substrate 508, and further comprises a gate structure (not shown) between the source/drain regions 520. The source/drain regions 520 are doped regions in a substrate 508 and have an opposite doping type as the bulk 508b of the substrate 508. In alternative embodiments, the source/drain regions 520 are on a well region (not shown) of the substrate 508 and have an opposite doping type as the well region.

Figure 5B:
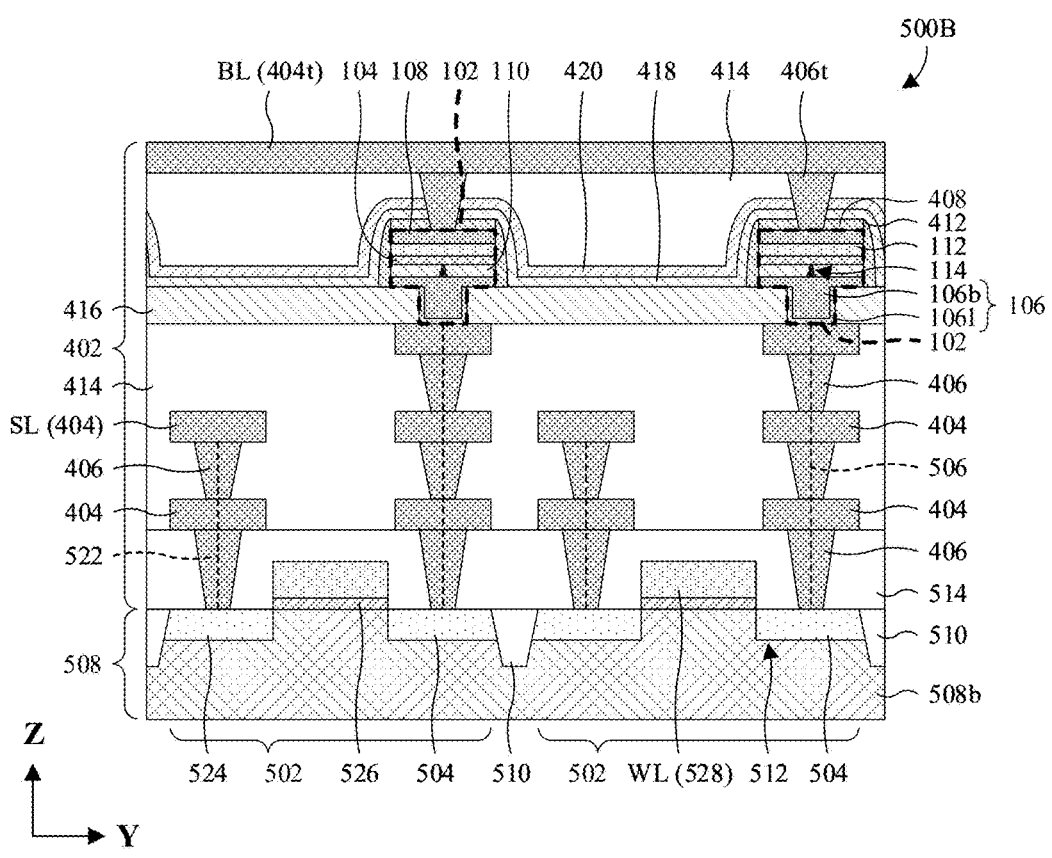

With reference to FIG. 5B, a cross-sectional view 500B of some embodiments of the integrated circuit chip of FIG. 5A is provided along an axis orthogonal to an axis along which the cross-sectional view 500A of FIG. 5A is taken. The 1T1R cells 502 comprise individual RRAM cells 102, individual drain-side conductive paths 506, individual access transistors 512, and individual source-side conductive paths 522. The RRAM cells 102 may, for example, each be as their counterpart in FIG. 4A is illustrated and described.

The access transistors 512 are on the substrate 508, between the substrate 508 and the interconnect structure 402. Further, the access transistors 512 are electrically separated from each other by the trench isolation structure 510. The access transistors 512 comprise individual drain regions 504, individual source regions 524, individual gate dielectric layers 526, and individual gate electrodes 528. The gate electrodes 528 respectively overlie the gate dielectric layers 526 and define word lines WL. The drain and source regions 504, 524 are doped regions of the substrate 508 and have an opposite doping type as the bulk 508b of the substrate 508. In alternative embodiments, the drain and source regions 504, 524 are on a well region (not shown) of the substrate 508 and have an opposite doping type as the well region. The drain regions 504 respectively border drain sides of the gate electrodes 528, and the source regions 524 respectively border source sides of the gate electrodes 528.

The drain-side conductive paths 506 electrically couple the drain regions 504 to the bottom electrodes 106 of the RRAM cells 102, and the source-side conductive paths 522 electrically couple the source regions 524 to source lines SL. The drain-side and source-side conductive paths 506, 522 are defined by the plurality of wires 404 and the plurality of vias 406 in the interconnect structure 402.

While FIGS. 5A and 5B are illustrated using RRAM-cell embodiments in FIG. 4A, RRAM-cell embodiments in any one of FIGS. 1, 3, and 4B-4F may alternatively be used. For example, the RRAM cells 102 of FIGS. 5A and 5B may each be as illustrated in FIG. 4B and may hence have individual sidewall spacer structures 412 overlying the barrier layers 104.

Figure 6:
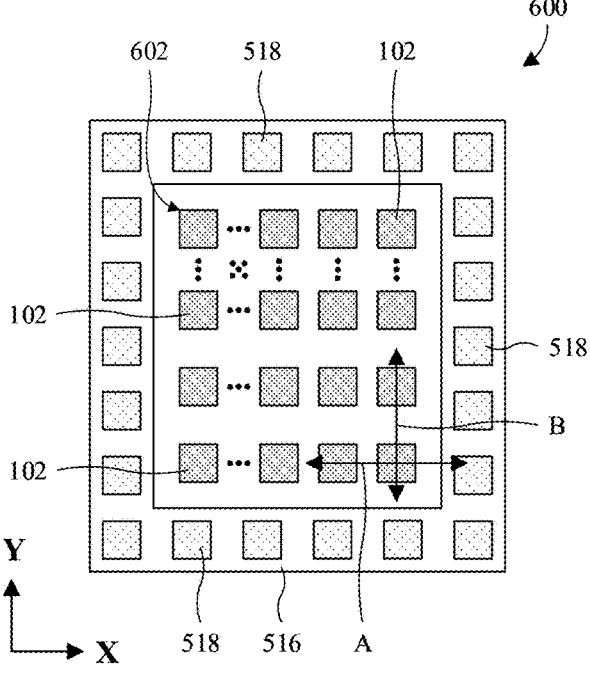
FIG. 6 illustrates a top layout of some embodiments of the integrated circuit chip of FIGS. 5A and 5B.

With reference to FIG. 6, a top layout 600 of some embodiments of the integrated circuit chip of FIGS. 5A and 5B is provided. The cross-sectional views 500A, 500B of FIGS. 5A and 5B may, for example, respectively be taken along lines A and B or other suitable locations. The integrated circuit chip comprises a plurality of RRAM cells 102 in a plurality of rows and a plurality of columns, thereby defining a RRAM array 602. The RRAM cells 102 may, for example, be as illustrated and described in any one of FIGS. 1, 3, 4A-4F, 5A, and 5B. Peripheral devices 518 surround the RRAM array 602 at a peripheral region 516 of the integrated circuit chip. The peripheral devices 518 may, for example, be or comprise transistors and/or other suitable semiconductor device(s). Further, the peripheral devices 518 may, for example, implement read/write circuitry and/or other suitable circuitry for operating the RRAM cells 102.

With reference to FIGS. 7-17, a series of cross-sectional views 700-1700 of some embodiments of a method for forming RRAM cells is provided in which the RRAM cells comprise individual barrier layers and are integrated with 1T1R cells in an integrated circuit chip is provided. The cross-sectional views 700-1700 may, for example, be taken along line A or some other suitable location in FIG. 6. Further, the cross-sectional views 700-1700 may, for example, correspond to FIG. 5A and hence may, for example, be as the integrated circuit chip of FIGS. 5A and 5B is illustrated and described.

Figure 7:
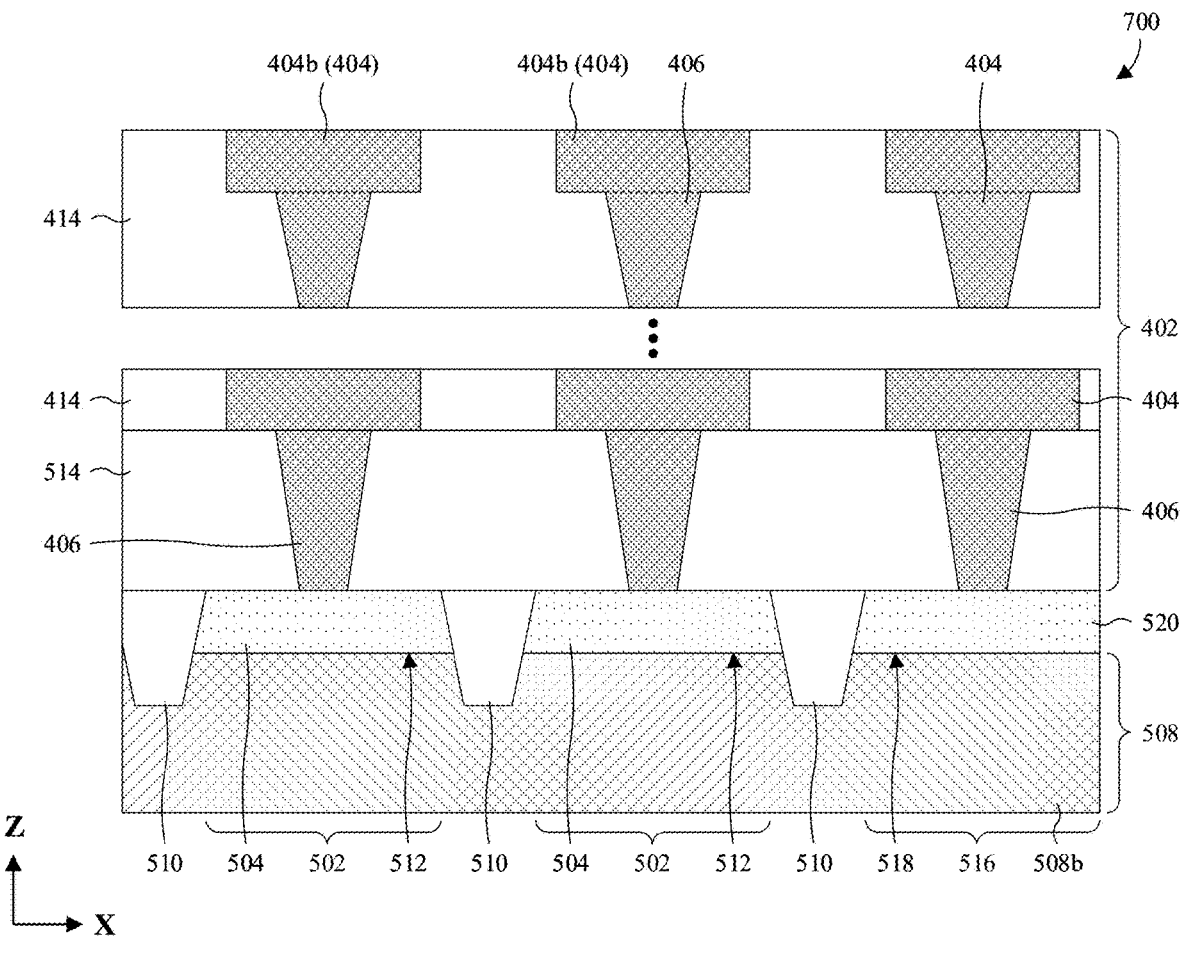

As illustrated by the cross-sectional view 700 of FIG. 7, a trench isolation structure 510 is formed extending into a top of a substrate 508. The trench isolation structure 510 individually surrounds and demarcates regions of the substrate 508 at which 1T1R cells 502 are being formed. Further, the trench isolation structure 510 surrounds and demarcates a peripheral region 516 of the integrated circuit chip. A process for forming the trench isolation structure 510 may, for example, comprise: 1) patterning the substrate 508 to form a trench with a top layout of the trench isolation structure 510 being formed; and 2) filling the trench with oxide and/or some other suitable dielectric(s). Other processes are, however, amenable.

Also illustrated by the cross-sectional view 700 of FIG. 7, a plurality of semiconductor devices is formed on a substrate 508. The plurality of semiconductor devices comprises access transistors 512 individual to and respectively at 1T1R cells 502 being formed. Further, the plurality of semiconductor devices comprises a peripheral device 518 at a peripheral region 516 of the integrated circuit chip. The access transistors 512 comprise individual drain regions 504 and individual source regions (not shown) in the substrate 508, overlying a bulk 508b of the substrate 508. Further, the access transistors 512 comprise individual gate structures (not shown). The gate structures have individual drain sides respectively bordering the drain regions 504 and further have individual source sides respectively bordering the source regions. The peripheral device 518 comprises a pair of source/drain regions 520 (only one of which is shown) in the substrate 508, overlying the bulk 508b of the substrate 508, and further comprises a gate structure (not shown) between and bordering the source/drain regions 520.

In some embodiments, a process for forming the plurality of semiconductor devices comprises: 1) depositing a dielectric layer on the substrate 508; 2) depositing a conductive layer on the dielectric layer; 3) patterning the dielectric layer and the conductive layer into gate structures (not shown) for the access transistors 512 and the peripheral device 518; and 4) doping the substrate 508 to form source/drain regions adjacent to the gate structures. The source/drain regions include the drain regions 504 of the access transistors 512, the source regions (not shown) of the access transistors 512, and the source/drain regions 520 of the peripheral device 518. Other processes are, however, amenable.

Also illustrated by the cross-sectional view 700 of FIG. 7, an interconnect structure 402 is partially formed over and electrically coupled to the semiconductor devices (e.g., the access transistor 512 and the peripheral device 518). The interconnect structure 402 comprises a dielectric structure, and further comprises a plurality of wires 404 and a plurality of vias 406 stacked in the dielectric structure. The dielectric structure comprises an ILD layer 514 and a plurality of IMD layers 414 over the ILD layer 514. The plurality of wires 404 comprises a plurality of bottom-electrode wires 404b along a top surface of the interconnect structure 402. The bottom-electrode wires 404b are individual to and respectively at the 1T1R cells 502 being formed. Further, the bottom-electrode wires 404b are respectively electrically coupled to the drain regions 504 of the access transistor 512 by underlying wires and vias.

In some embodiments, a process for partially forming the interconnect structure 402 comprises: 1) forming a bottommost level of the vias 406 by a single damascene process; 2) forming a bottommost level of the wires 404 by the single damascene process; and 3) repeatedly performing a dual damascene process to form additional wire and via levels. Other processes are, however, amenable. The single damascene process may, for example, comprises: 1) depositing a portion of the dielectric structure; 2) patterning the deposited portion of the dielectric structure to form openings with a layout for a single level of wires or vias being formed; 3) depositing a conductive layer in the openings; and 4) performing a chemical mechanical polish (CMP) into the conductive layer until a top surface of the conductive layer is even with a top surface of the deposited portion of the dielectric structure. The dual damascene process may, for example, be as the single damascene process is described except that the patterning at 3) forms openings with a layout for a level of wires and a level of vias being formed. Other processes are, however, amenable for the single and dual damascene processes.

Figure 8:
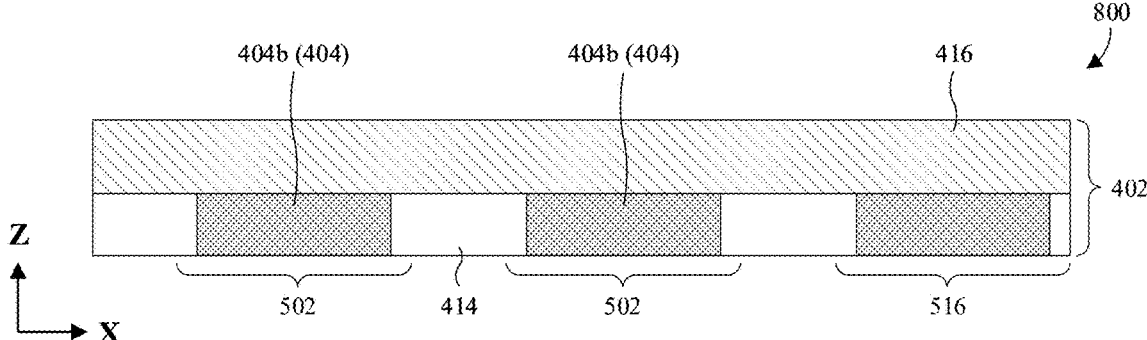

As illustrated by the cross-sectional view 800 of FIG. 8, a via dielectric layer 416 is formed on the interconnect structure 402. Note that for drawing compactness, a lower portion of the interconnect structure 402 is omitted herein and in subsequent figures. The via dielectric layer 416 may be or comprise, for example, silicon carbide and/or some other suitable dielectric(s). Further, the via dielectric layer 416 may be formed by, for example, vapor deposition and/or some other suitable deposition process(es).

Figure 9:
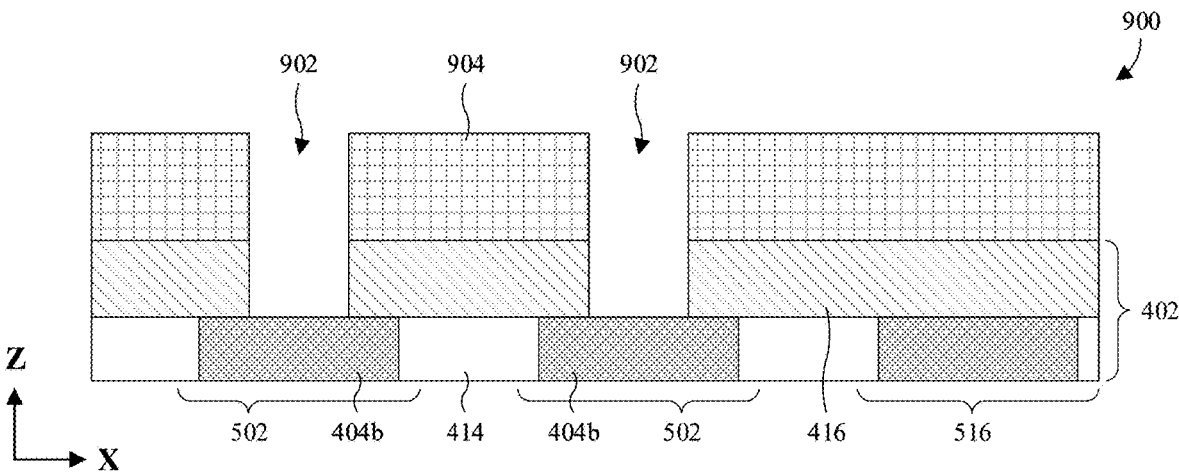

As illustrated by the cross-sectional view 900 of FIG. 9, the via dielectric layer 416 is patterned to form via openings 902 individual to and respectively at the 1T1R cells 502 being formed. The via openings 902 extend through the via dielectric layer 416 and respectively expose the bottom-electrode wires 404b. The patterning may, for example, be performed by: 1) forming a photoresist mask 904 over the via dielectric layer 416 using photolithography; 2) performing an etch into the via dielectric layer 416 with the photoresist mask 904 in place; and 3) removing the photoresist mask 904. Other processes are, however, amenable.

Figure 10:
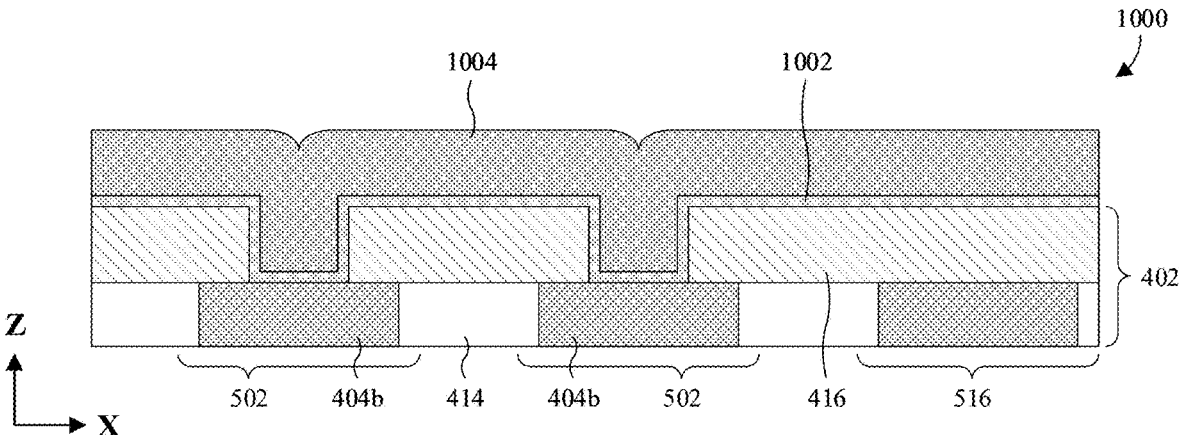

As illustrated by the cross-sectional view 1000 of FIG. 10, a liner layer 1002 is deposited over the via dielectric layer 416, lining and partially filling the via openings 902 (see FIG. 9). Further, a first conductive layer 1004 is deposited over the liner layer 1002, covering the liner layer 1002 and filling the via openings 902. In some embodiments, the liner layer 1002 is an adhesion layer to enhance adhesion of the first conductive layer 1004 to the via dielectric layer 416. Further, in some embodiments, the liner layer 1002 is a diffusion-barrier for material of the bottom-electrode wires 404$b$. The liner layer 1002 may, for example, be or comprise tantalum nitride, titanium nitride, or some other suitable material. The first conductive layer 1004 has a low reactivity to oxygen and is or comprises tungsten and/or some other suitable material(s). Such a low-reactivity material may, for example, be a material depending upon 5 eV or more to react with oxygen. The liner layer 1002 and/or the first conductive layer 1004 may be formed by, for example, vapor deposition and/or some other suitable deposition process(es).

Figure 11:
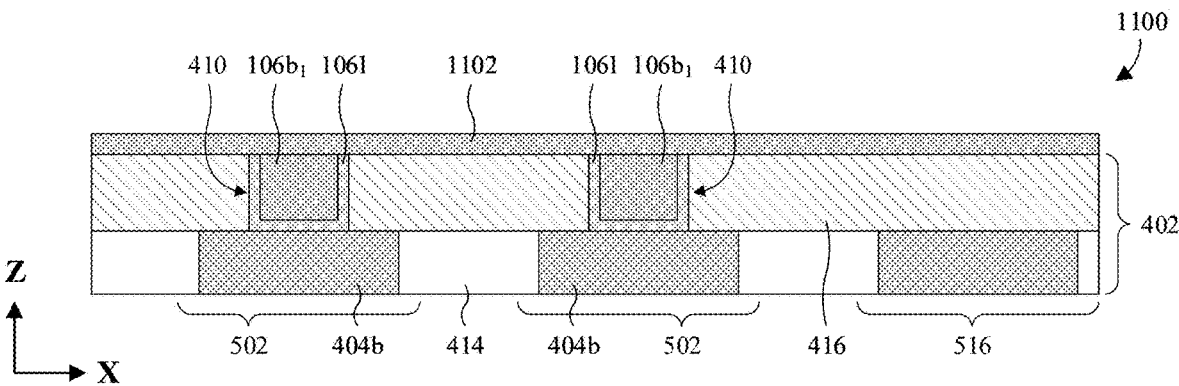

As illustrated by the cross-sectional view 1100 of FIG. 11, a planarization is performed into the liner layer 1002 (see FIG. 10) and the first conductive layer 1004 (see FIG. 10). The planarization forms bottom-electrode liners 106$l$ and first bottom-electrode body segments 106$b_1$ in the via openings 902 (see FIG. 9). The bottom-electrode liners 106$l$ respectively underlie and cup the first bottom-electrode body segments 106$b_1$. Further, the bottom-electrode liners 106$l$ and the first bottom-electrode body segments 106$b_1$ define bottom-electrode vias 410 respectively in the via openings 902. The planarization may, for example, be a CMP and/or some other suitable planarization.

Also illustrated by the cross-sectional view 1100 of FIG. 11, a second conductive layer 1102 is deposited over the bottom-electrode vias 410 and the via dielectric layer 416. The second conductive layer 1102 has a low reactivity to oxygen. Such a low-reactivity material may, for example, be a material depending upon 5 eV or more to react with oxygen. Further, the second conductive layer 1102 may be or comprise the same material as the first conductive layer 1004 (see FIG. 10) and/or some other suitable low-reactivity material(s). The second conductive layer 1102 may be formed by, for example, vapor deposition and/or some other suitable deposition process(es).

Figure 12:
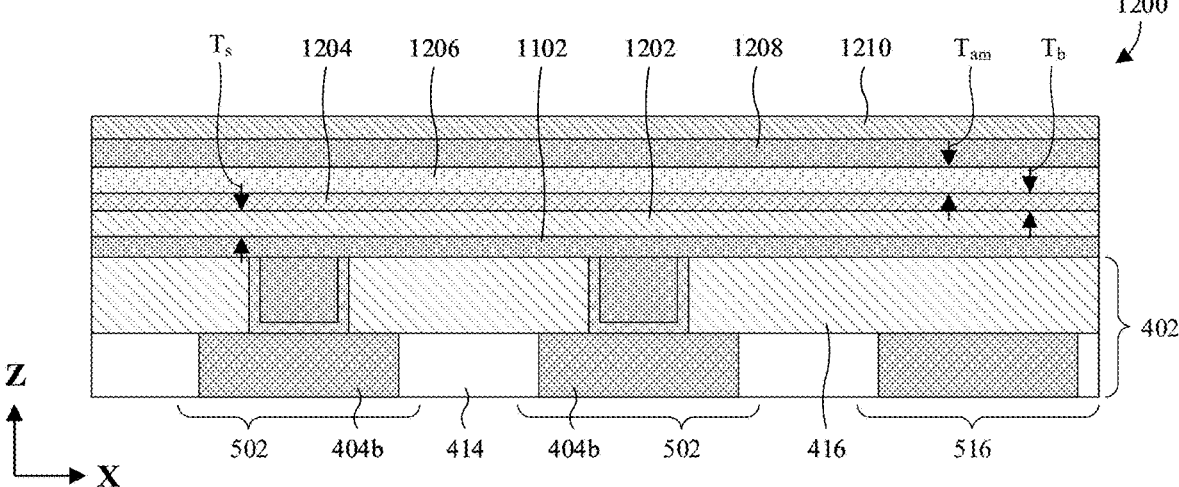

As illustrated by the cross-sectional view 1200 of FIG. 12, a switching layer 1202, a barrier layer 1204, an active metal layer 1206, a third conductive layer 1208, and a hard mask layer 1210 are deposited over the second conductive layer 1102. The switching layer 1202 overlies the second conductive layer 1102, the barrier layer 1204 overlies the switching layer 1202, the active metal layer 1206 overlies the barrier layer 1204, the third conductive layer 1208 overlies the active metal layer 1206, and the hard mask layer 1210 overlies the third conductive layer 1208. The barrier layer 1204 may, for example, be deposited by physical vapor deposition (PVD), chemical vapor deposition (CVD), atomic layer deposition (ALD), or some other suitable deposition process(es). The active metal layer 1206 may, for example, be deposited by PVD, CVD, or some other suitable deposition process(es). The switching layer 1202, the third conductive layer 1208, and the hard mask layer 1210 may, for example, be deposited by vapor deposition and/or some other suitable deposition process(es).

The switching layer 1202 and the barrier layer 1204 are respectively dielectric and conductive. Further, the switching layer 1202 and the barrier layer 1204 are respectively an electrolyte and a barrier for metal cations that result from oxidation of the active metal layer 1206. In some embodiments, the barrier layer 1204 has a smaller lattice constant and/or a greater density than the active metal layer 1206 so it's more difficult for metal cations from the active metal layer 1206 to move through the barrier layer 1204. Non-limiting examples are described above with regard to the barrier layer 104 of FIG. 1. As seen hereafter, slowing the migration of metal cations through the barrier layer 1204 enhances endurance of RRAM cells formed from the barrier layer 1204. In some embodiments, the barrier layer 1204 is or comprises tantalum, tantalum nitride, some other suitable barrier material(s), or any combination of the foregoing. The barrier layer 1204 may, for example, be as the barrier layer 104 of FIG. 1 is described.

In some embodiments, the barrier layer 1204 has a barrier thickness $T_b$ of about 1-10 nm, about 1-5 nm, or about 5-10 nm. Other thicknesses are, however, amenable. If the barrier layer 1204 is too thin (e.g., less than about 1 nm or some other suitable value), the barrier layer 1204 may be unable to slow migration of metal cations through the barrier layer 1204. On the other hand, if the barrier layer 1204 is too thick (e.g., more than 10 nm or some other suitable value), the barrier layer 1204 may completely block or overly slow migration of metal cations through the barrier layer 1204. This, in turn, may prevent RRAM cells formed from the barrier layer 1204 from operating and/or may move operating parameters of the RRAM cells out of specification. Additionally, or alternatively, if the barrier layer 1204 is too thick (e.g., 10 nm or some other suitable value), the barrier layer 1204 may make integration with existing processes more difficult. In some embodiments, a ratio of the barrier thickness $T_b$ to an active-metal thickness $T_{am}$ of the active metal layer 1206 is about 1:1-500, about 1:1-250, about 1:250-500, or some other suitable ratio. Further, in some embodiments a ratio of the barrier thickness $T_b$ to the switching thickness $T_s$ of the switching layer 1202 is about 1:0.1-50, about 1:0.1-25, about 1:0.5-50, or some other suitable ratio. In some embodiments, a TTV of the barrier layer 1204 is less than about 1 angstrom, 2 angstroms, or some other suitable value. If the TTV is too large (e.g., greater than about 2 angstroms or some other suitable value), electric field uniformity across RRAM cells formed from the barrier layer 1204 may be low. This may, in turn, decrease bulk manufacturing yields and/or degrade performance of the RRAM cells. Additionally, or alternatively, if the TTV is too large (e.g., greater than about 2 angstroms or some other suitable value), portions of the barrier layer 1204 may be too thin (e.g., less than about 1 nm or some other suitable value). As noted above, the barrier layer 1204 may be unable to slow migration of metal cations through the barrier layer 1204 if the barrier layer 1204 is too thin.

The active metal layer 1206 is electrochemically active and has a high reactivity to oxygen relative to the third conductive layer 1208. Such a high-reactivity material may, for example, be a material depending upon 3 eV or less to react with oxygen. In some embodiments, the active metal layer 1206 is or comprises aluminum and/or some other suitable material(s). The third conductive layer 1208 has a low reactivity to oxygen compared to the active metal layer 1206. Such a low-reactivity material may, for example, be a material depending upon 5 eV or more to react with oxygen. Further, the third conductive layer 1208 may be or comprise the same material as the second conductive layer 1102, the same material as the first conductive layer 1004 (see FIG. 10), or some other suitable low-reactivity material(s).

Figure 13:
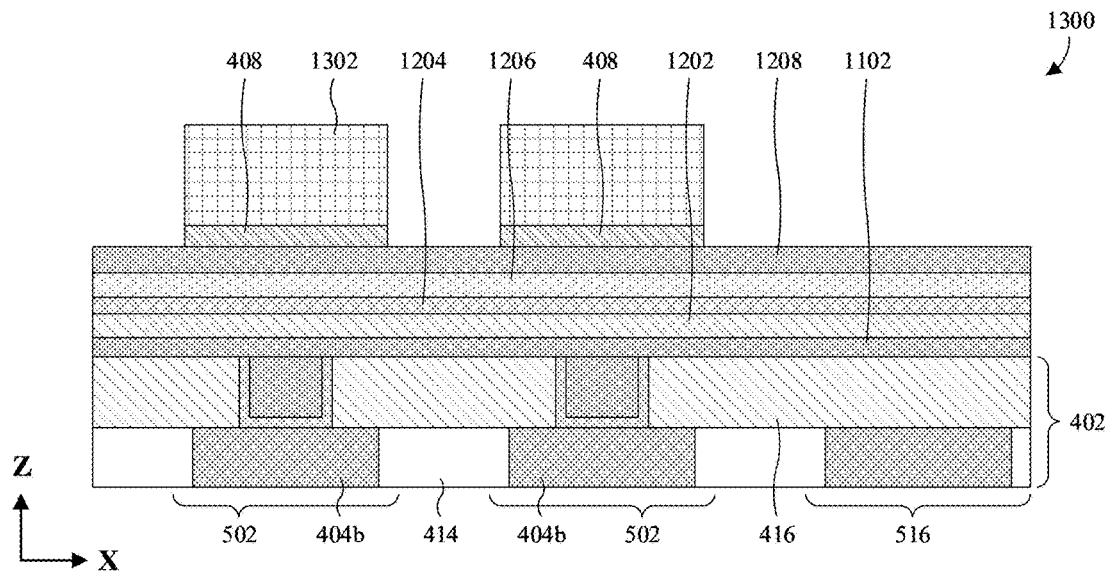

As illustrated by the cross-sectional view 1300 of FIG. 13, the hard mask layer 1210 (see FIG. 12) is patterned to form hard masks 408 individual to and respectively at the 1T1R cells 502 being formed. As seen hereafter, the hard masks 408 individually have patterns for RRAM cells of the 1T1R cells 502. The patterning may, for example, be performed by: 1) forming a photoresist mask 1302 over the hard mask layer 1210 using photolithography; 2) performing an etch into the hard mask layer 1210 with the photoresist mask 1302 in place; and 3) removing the photoresist mask 1302. Other processes are, however, amenable.

Figure 14:
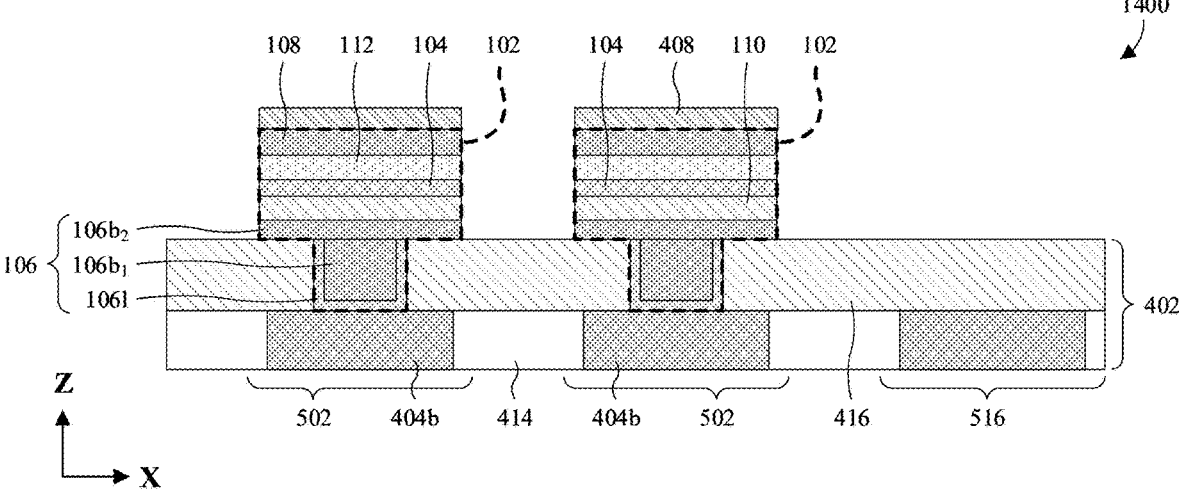

As illustrated by the cross-sectional view 1400 of FIG. 14, an etch is performed into the second conductive layer 1102 (see FIG. 13), the switching layer 1202 (see FIG. 13), the barrier layer 1204 (see FIG. 13), the active metal layer 1206 (see FIG. 13), and the third conductive layer 1208 (see FIG. 13) with the hard masks 408 in place. The etch transfers patterns of the hard masks 408 to the underlying layers to form RRAM cells 102 individual to and respectively at the 1T1R cells 502. The RRAM cells 102 comprise individual top electrodes 108, individual active metal layers 112, individual barrier layers 104, individual switching layers 110, and individual bottom electrodes 106. The individual top electrodes 108 are formed from the third conductive layer 1208, the individual active metal layers 112 are formed from the active metal layer 1206, the individual barrier layers 104 are formed from the barrier layer 1204, the individual switching layers 110 are formed from the switching layer 1202, and the individual bottom electrodes 106 are partially formed from the second conductive layer 1102. The individual bottom electrodes 106 comprise the bottom-electrode liners 106l and the first bottom-electrode body segments $106b_1$. Further, the individual bottom electrodes 106 comprise second bottom-electrode body segments $106b_2$ formed from the second conductive layer 1102.

By arranging the individual barrier layers 104 between the individual switching and active metal layers 110, 112, switching cycling reliability may be increased. For example, where an active metal layer 112 of an RRAM cell 102 is or comprises aluminum and a barrier layer 104 of the RRAM cell 102 is or comprise tantalum or tantalum nitride, the barrier layer 104 may reduce the number of aluminum cations entering the switching layer 110 while setting the RRAM cell 102. As noted above, filaments in the switching layer 110 build-up and hence thicken (i.e., thicken) over time. This, in turn, eventually leads to failure. By reducing the number of aluminum cations entering the switching layer 110, the speed with which filaments of the RRAM cell 102 build-up or thicken decreases and hence endurance increases.

Figure 15:
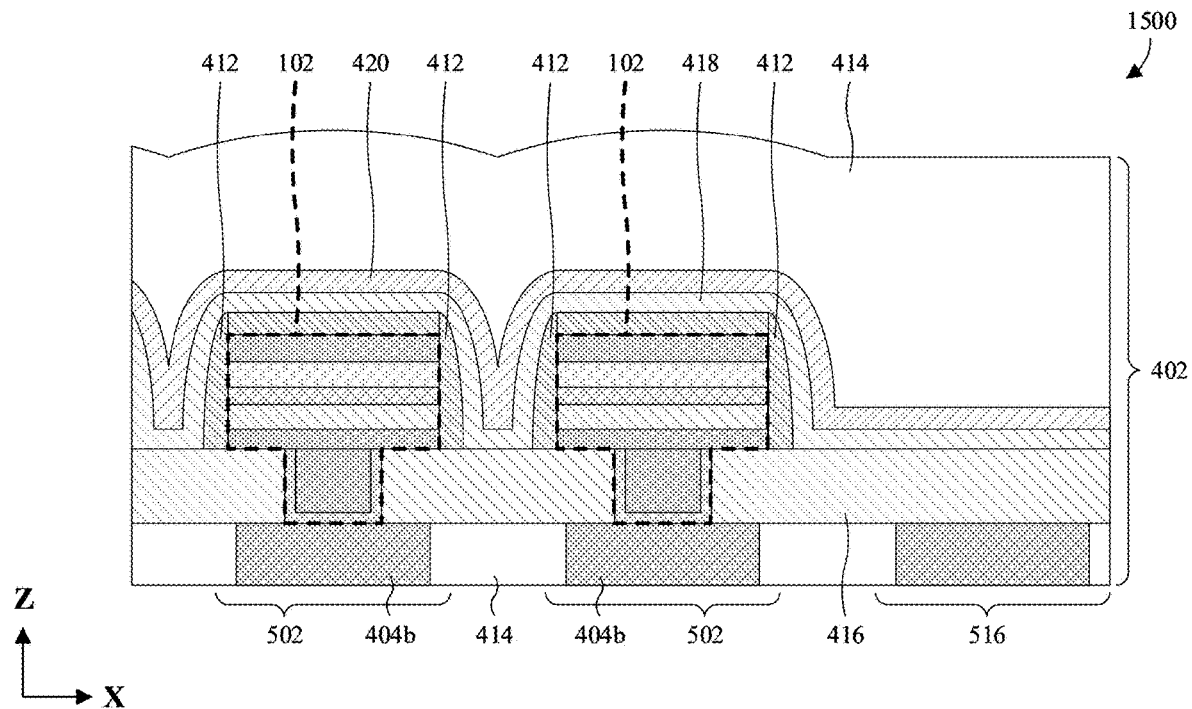

As illustrated by the cross-sectional view 1500 of FIG. 15, sidewall spacer structures 412 are formed on sidewalls of the RRAM cells 102. The sidewall spacer structures 412 may, for example, be formed by: 1) depositing a first dielectric layer on the RRAM cells 102; 2) depositing a second dielectric layer on the first dielectric layer; and 3) etching back the first and second dielectric layers to remove lateral, but not vertical, segments of the dielectric layer. Other processes are, however, amenable. The first dielectric layer may, for example, be silicon oxide and/or some other suitable dielectric(s), whereas the second dielectric layer may, for example, be silicon nitride and/or some other suitable dielectric(s). Note that hashing of the sidewall spacer structures 412 is not varied to illustrate the different materials.

Also illustrated by the cross-sectional view 1500 of FIG. 15, an etch stop layer 418, a IMD liner 420, and an IMD layer 414 are deposited over the RRAM cells 102 and the sidewall spacer structures 412. The etch stop layer 418, the IMD liner 420, and the IMD layer 414 may, for example, be formed by vapor deposition and/or some other suitable deposition process(es).

Figure 16:
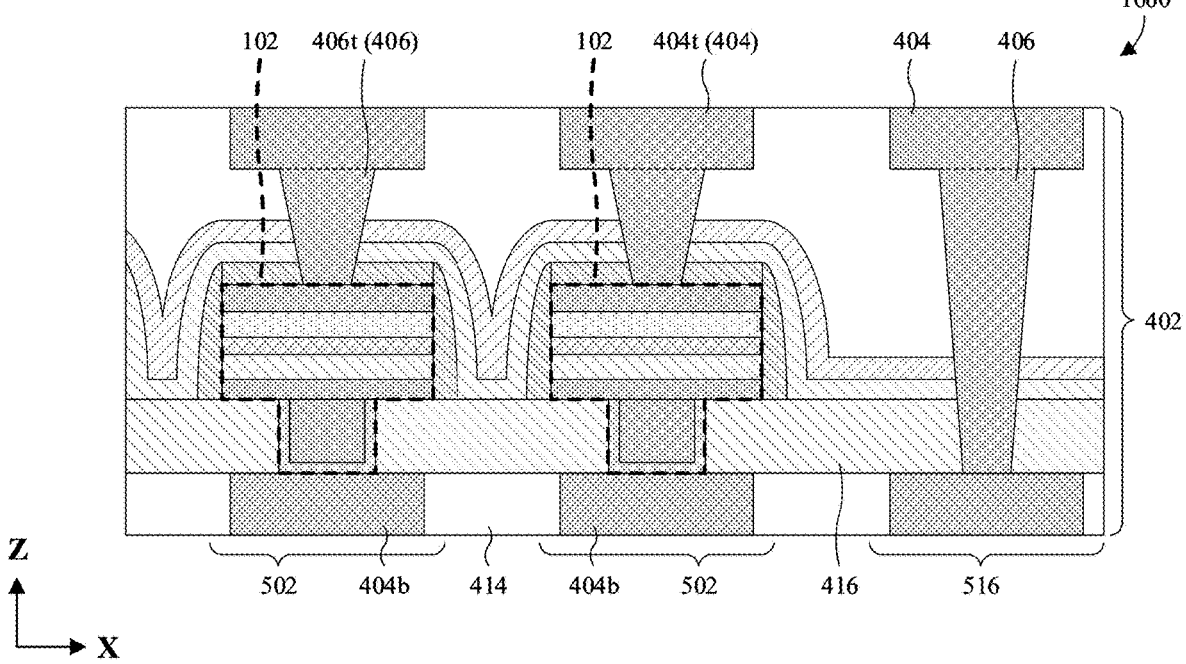

As illustrated by the cross-sectional view 1600 of FIG. 16, a plurality of additional wires 404 and a plurality of additional vias 406 are formed over the RRAM cells 102, recessed into the IMD layer 414 above the RRAM cells 102. The plurality of additional wires 404 comprises top-electrode wires 404t respectively overlying the RRAM cells 102, and the plurality of additional vias 406 comprises top-electrode vias 406t extending from the top-electrode wires 404t to the RRAM cells 102. The forming may, for example, comprise: 1) patterning the IMD layer 414, the etch stop layer 418, and the IMD liner 420 to form openings for the additional wires 404 and the additional vias 406; 2) depositing a conductive layer in the openings; and 3) performing a CMP into the conductive layer until a top surface of the conductive layer is even with the IMD layer 414. Other processes are, however, amenable.

As illustrated by the cross-sectional view 1700 of FIG. 17, metal filaments 114 individual to and respectively in the switching layers 110 are formed. The forming may, for example, comprise applying a forming voltage across each of the RRAM cells 102. For example, the bottom electrodes 106 of the RRAM cells 102 may be grounded while the top electrodes 108 are biased. Other processes for forming the metal filaments 114 are, however, amenable. In some embodiments, by arranging the individual barrier layers 104 between the individual switching and active metal layers 110, 112, the forming voltage is decreased. For example, the forming voltage may be reduced about 20-40%, about 20-30%, about 30-40%, about 30%, or some other suitable value. Other percentages are, however, amenable. By decreasing the forming voltage, power consumption is reduced and forming fail bits are reduced.

While FIGS. 7-17 are described with reference to a method, it will be appreciated that the structures shown in FIGS. 7-17 are not limited to the method but rather may stand alone separate of the method. While FIGS. 7-17 are described as a series of acts, it will be appreciated that the order of the acts may be altered in other embodiments. While FIGS. 7-17 illustrate and describe as a specific set of acts, some acts that are illustrated and/or described may be omitted in other embodiments. Further, acts that are not illustrated and/or described may be included in other embodiments. While FIGS. 7-17 illustrate the method with embodiments of the RRAM cells 102 in FIG. 5A, alternative embodiments of the method may be performed with embodiments of the RRAM cells 102 in any one or combination of FIGS. 4A-4F.

In some embodiments, to perform the method with embodiments of the RRAM cells 102 in FIG. 4B, the etch at FIG. 14 stops at the barrier layer 1204. This forms the individual top electrodes 108 and the individual active metal layers 112, examples of each are shown in FIG. 4B. The sidewall spacer structures 412 are then formed as described at FIG. 15. Further, an additional etch is selectively performed into the barrier layer 1204, the switching layer 1202, and the second conductive layer 1102 using the hard masks 408 and the sidewall spacer structures 412 as a mask. The additional etch is performed between the forming of the sidewall spacer structures 412 at FIG. 15 and the depositing of the etch stop layer 418 at FIG. 15. The additional etch forms the individual barrier layers 104, the individual switching layers 110, and the individual bottom electrodes 106, examples of each are shown in FIG. 4B. After the additional etch, the method proceeds as described above from the depositing of the etch stop layer 418 at FIG. 15.

In some embodiments, the method is performed with embodiments of the RRAM cells 102 at FIG. 4C in the same manner as described above for embodiments of the RRAM cells 102 at FIG. 4B, except the etch at FIG. 14 stops on the switching layer 1202. In some embodiments, the method is performed with embodiments of the RRAM cells 102 at FIG. 4D by omitting the acts at FIG. 10 and by omitting the planarization at FIG. 11.

In some embodiments, to perform the method with embodiments of the RRAM cells 102 in FIG. 4F, an etch back is performed between the depositing of the liner layer 1002 at FIG. 10 and the depositing of the first conductive layer 1004. The etch back forms the bottom-electrode liners 106l with top surfaces recessed relative to a top surface of the via dielectric layer 416. An example of such a bottom-electrode liner 106l is shown in FIG. 4F. After the etch back, the method proceeds as described above from the depositing of the first conductive layer 1004. Because the top surfaces of the bottom-electrode liners 106l are recessed, the planarization at FIG. 11 does not reach the bottom-electrode liners 106l and top surfaces of the bottom-electrode vias 410 have a single hardness. Because the top surfaces of the bottom-electrode vias 410 have a single hardness, the planarization is more uniform at the top surfaces of the bottom-electrode vias 410 and an electric field produced by the bottom-electrode vias 410 is more uniform.

With reference to FIG. 18, a block diagram 1800 of some embodiments of the method of FIGS. 7-17 is provided.

At 1802, an interconnect structure is partially formed over a substrate, where the interconnect structure comprises a bottom-electrode wire. See, for example, FIG. 7.

At 1804, a via dielectric layer is formed over the interconnect structure. See, for example, FIG. 8.

At 1806, a bottom-electrode via is formed extending through the via dielectric layer to the bottom-electrode wire. See, for example, FIGS. 9-11.

At 1808, a multilayer memory film is formed on the via dielectric layer and the bottom-electrode via, where the multilayer memory film comprises a switching layer, an active metal layer, and a barrier layer between the switching and active metal layers. See, for example, FIG. 12.

At 1810, the multilayer memory film is patterned to form a memory cell overlying and electrically coupled to the bottom-electrode wire. See, for example, FIGS. 13 and 14.

At 1812, the interconnect structure is completed around the memory cell. See, for example, FIGS. 15 and 16.

At 1814, a forming voltage is applied across the memory cell to form a metal filament in the switching layer, where the barrier layer slows migration of metal cations from the active metal layer to the switching layer while forming the metal filament. See, for example, FIG. 17.

While the block diagram 1800 of FIG. 18 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 19-23, a series of cross-sectional views 1900-2300 of some alternative embodiments of the method of FIGS. 7-17 is provided in which the method is performed with embodiments of the RRAM cells 102 in FIG. 4F. As with the cross-sectional views 700-1700 of FIGS. 7-17, the cross-sectional views 1900-2300 may, for example, be taken along line A or some other suitable location in FIG. 6

Figure 19:
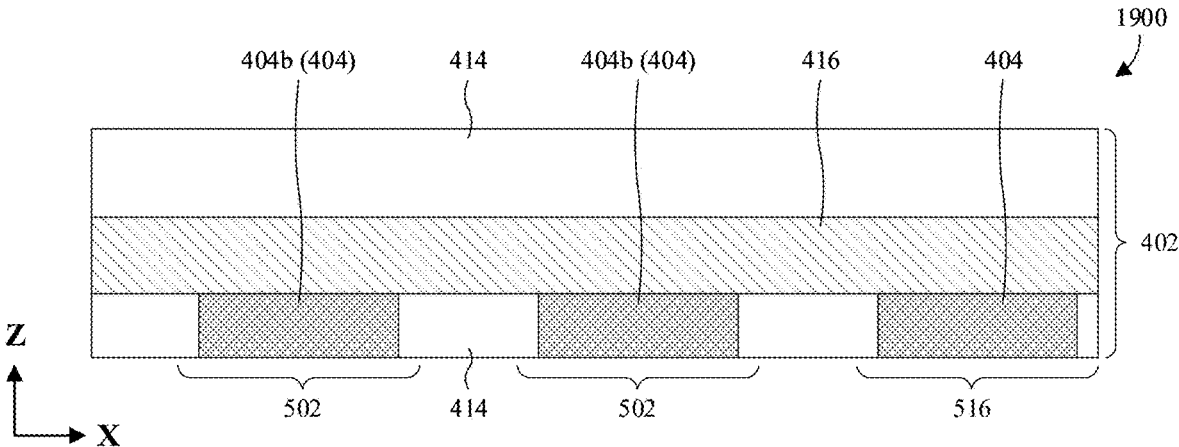
FIGS. 19-23 illustrate a series of cross-sectional views of some alternative embodiments of the method of FIGS. 7-17 in which the method is performed with RRAM-cell embodiments in FIG. 4F.

As illustrated by the cross-sectional view 1900 of FIG. 19, an interconnect structure 402 is partially formed. The interconnect structure 402 comprises a dielectric structure, a plurality of wires 404, and a plurality of vias (not shown). The dielectric structure comprises a plurality of IMD layers 414 and further comprises a via dielectric layer 416 between the IMD layers 414. Further, the wires 404 and the vias are alternatingly stacked in the dielectric structure to define conductive paths. The interconnect structure 402 may, for example, be partially formed as illustrated and described in FIG. 7.

Note that only an upper portion of the interconnect structure 402 is illustrated for drawing compactness. A remainder of the interconnect structure 402 may, for example, be as illustrated in FIG. 7. Further note that even though not shown, the interconnect structure 402 overlies and is electrically coupled to a substrate and semiconductor devices. The substrate and/or the semiconductor devices may, for example, be as illustrated at FIG. 7. Further, the substrate and/or the semiconductor devices may, for example, be formed as described at FIG. 7.

Figure 20:
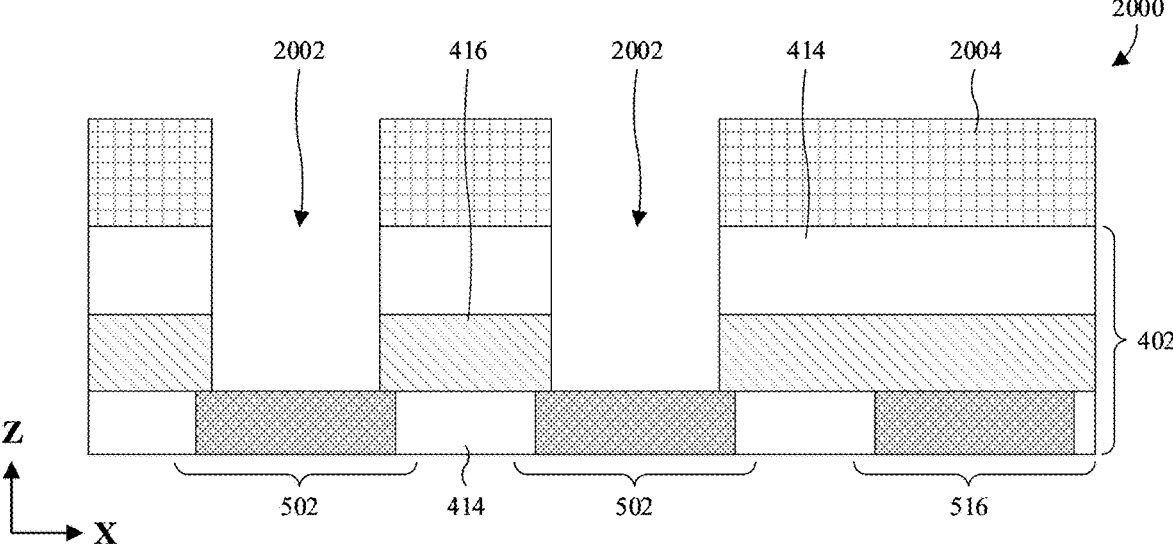

As illustrated by the cross-sectional view 2000 of FIG. 20, the via dielectric layer 416 and the IMD layer 414 atop the via dielectric layer 416 are patterned to form memory-cell openings 2002 individual to and respectively at the 1T1R cells 502 being formed. The patterning may, for example, be performed by: 1) forming a photoresist mask 2004 using photolithography; 2) performing an etch into the via dielectric layer 416 and the IMD layer 414 with the photoresist mask 2004 in place; and 3) removing the photoresist mask 2004. Other processes are, however, amenable.

Figure 21:
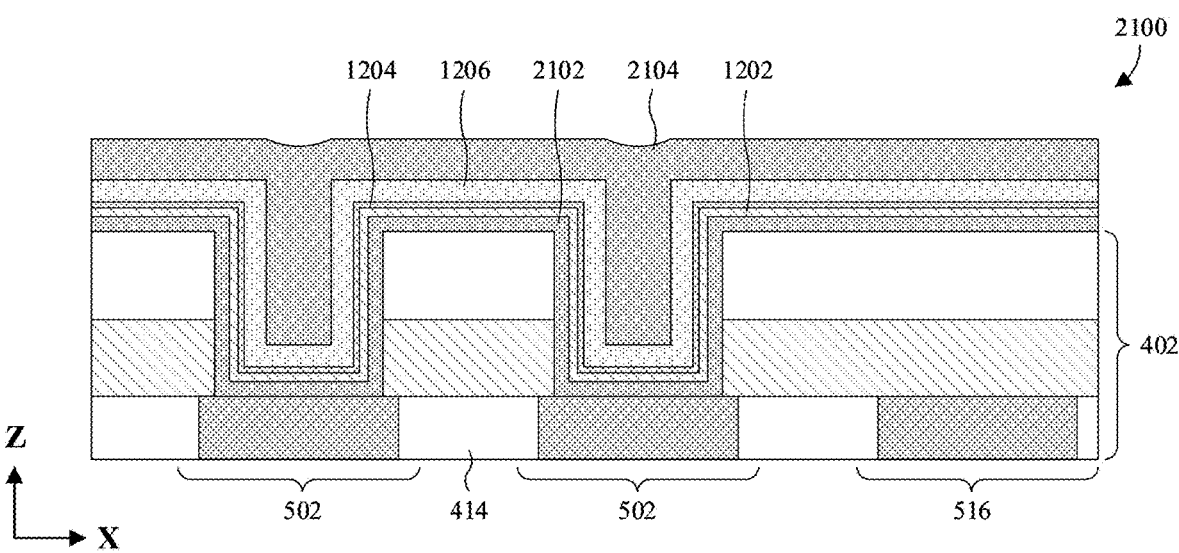

As illustrated by the cross-sectional view 2100 of FIG. 21, a first conductive layer 2102, a switching layer 1202, a barrier layer 1204, an active metal layer 1206, and a second conductive layer 2104 are deposited lining the memory-cell openings 2002 (see FIG. 20). The first and second conductive layers 2102, 2104 have a low reactivity to oxygen relative to the active metal layer 1206. Such a low-reactivity material may, for example, be a material depending upon 5 eV or more to react with oxygen. The switching layer 1202, the barrier layer 1204, and the active metal layer 1206 may, for example, be as described with regard to FIG. 12.

The barrier layer 1204 may, for example, be deposited by PVD, CVD, ALD, or some other suitable deposition process (es). The active metal layer 1206 may, for example, be deposited by PVD, CVD, or some other suitable deposition process(es). The switching layer 1202, the first conductive layer 2102, and the second conductive layer 2104 may, for example, be deposited by vapor deposition and/or some other suitable deposition process(es).

Figure 22:
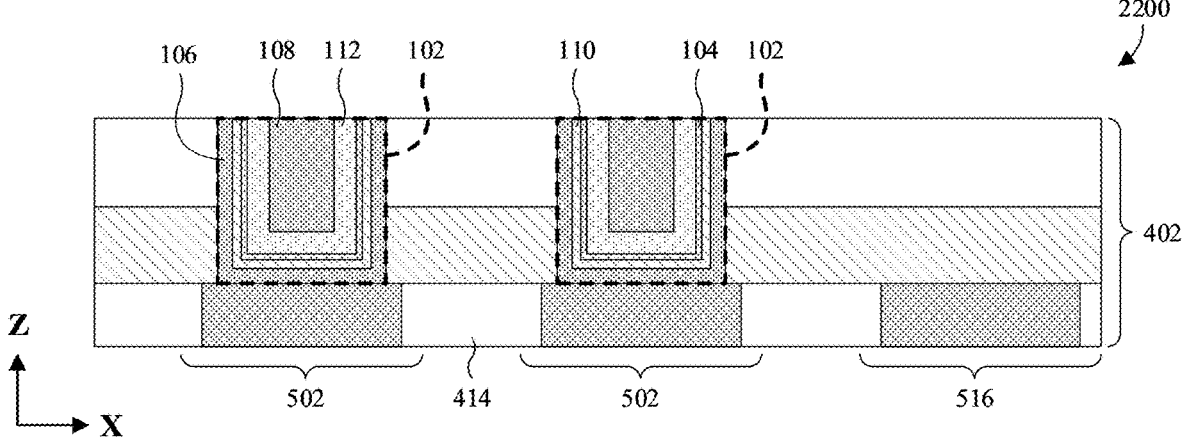

As illustrated by the cross-sectional view 2200 of FIG. 22, a planarization is performed into the first conductive layer 2102 (see FIG. 21), the switching layer 1202 (see FIG. 21), the barrier layer 1204 (see FIG. 21), the active metal layer 1206 (see FIG. 21), and the second conductive layer 2104 (see FIG. 21) to form RRAM cells 102 individual to and respectively at the 1T1R cells 502. The RRAM cells 102 comprise individual top electrodes 108, individual active metal layers 112, individual barrier layers 104, individual switching layers 110, and individual bottom electrodes 106. The individual top electrodes 108 are formed from the second conductive layer 2104, the individual active metal layers 112 are formed from the active metal layer 1206, the individual barrier layers 104 are formed from the barrier layer 1204, the individual switching layers 110 are formed from the switching layer 1202, and the individual bottom electrodes 106 are formed from the first conductive layer 2102. The planarization may, for example, be or comprise a CMP or some other suitable planarization.

Because the planarization transfers a pattern from the selective etching of FIG. 20 to the various layers of the RRAM cells 102, the RRAM cells 102 may be formed by a single photolithography/etching process. This is in contrast to the multiple photolithography/etching processes used to form the RRAM cells 102 at FIGS. 7-17. By reducing the number of photolithography/etching processes, costs are reduced.

Figure 23:
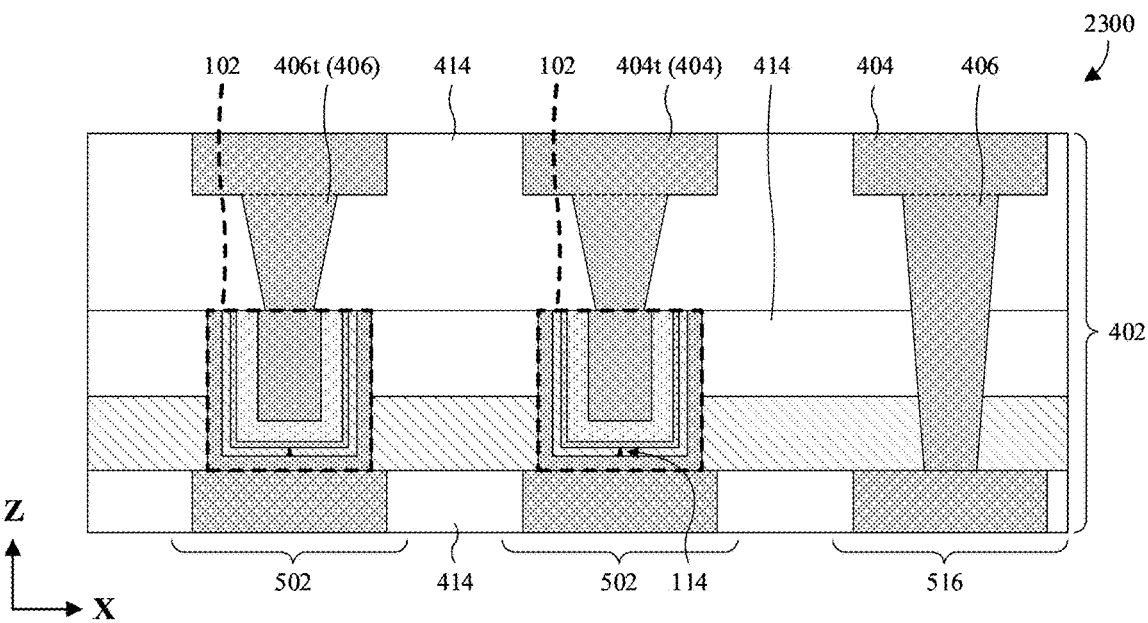

As illustrated by the cross-sectional view 2300 of FIG. 23, an IMD layer 414 is deposited over the RRAM cells 102. The IMD layer 414 may, for example, be formed by vapor deposition and/or some other suitable deposition process(es).

Also illustrated by the cross-sectional view 2300 of FIG. 23, a plurality of additional wires 404 and a plurality of additional vias 406 are formed over the RRAM cells 102, recessed into the IMD layer 414 above the RRAM cells 102. The plurality of additional wires 404 and the plurality of additional vias 406 may, for example, be formed as described at FIG. 16.

Also illustrated by the cross-sectional view 2300 of FIG. 23, metal filaments 114 individual to and respectively in the switching layers 110 are formed. The forming may, for example, be performed as described at FIG. 17.

While FIGS. 19-23 are described with reference to a method, it will be appreciated that the structures shown in FIGS. 19-23 are not limited to the method but rather may stand alone separate of the method. While FIGS. 19-23 are described as a series of acts, it will be appreciated that the order of the acts may be altered in other embodiments. While FIGS. 19-23 illustrate and describe as a specific set of acts, some acts that are illustrated and/or described may be omitted, and acts that are not illustrated and/or described may be included, in other embodiments.

Figure 24:
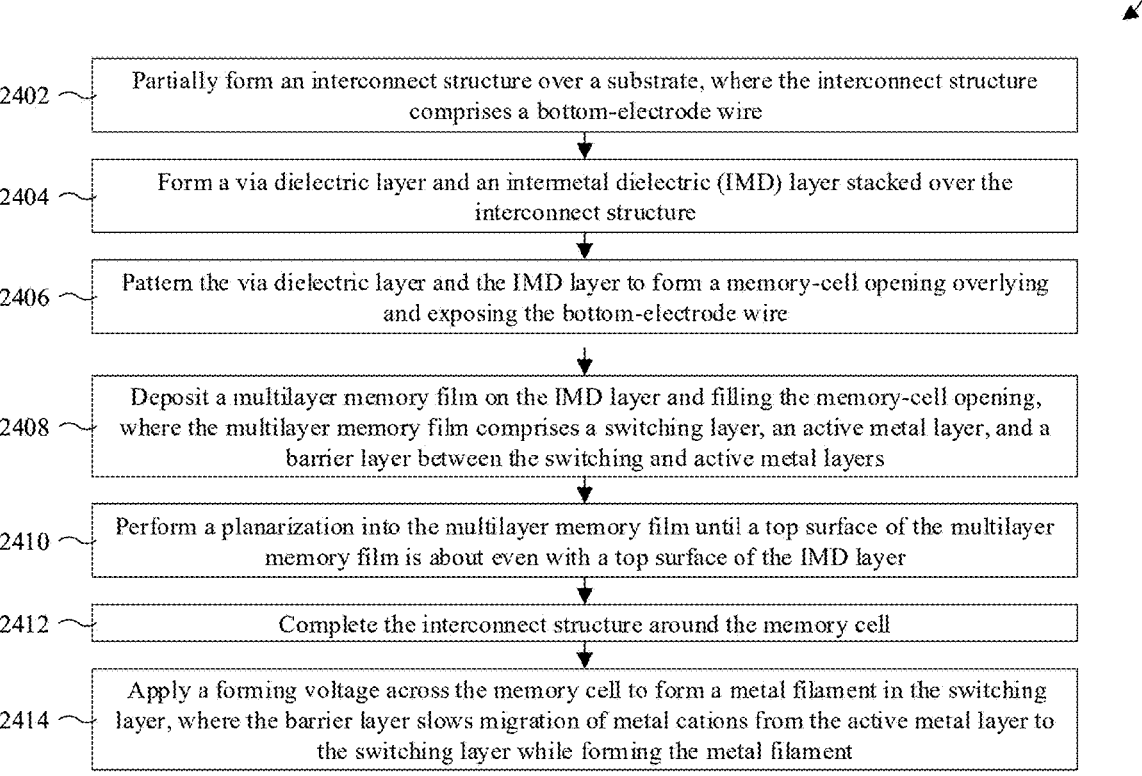
FIG. 24 illustrates a block diagram of some embodiments of the method of FIGS. 19-23.

With reference to FIG. 24, a block diagram 2400 of some alternative embodiments of the method of FIGS. 19-23 is provided.

At 2402, an interconnect structure is partially formed over a substrate, where the interconnect structure comprises a bottom-electrode wire. See, for example, FIG. 19.

At 2404, a via dielectric layer and an IMD layer are formed stacked over the interconnect structure. See, for example, FIG. 19.

At 2406, the via dielectric layer and the IMD layer are patterned to form a memory-cell opening overlying and exposing the bottom-electrode wire. See, for example, FIG. 20.

At 2408, a multilayer memory film is formed on the IMD layer and filling the memory-cell opening, where the multilayer memory film comprises a switching layer, an active metal layer, and a barrier layer between the switching and active metal layers. See, for example, FIG. 21.

At 2410, a planarization is performed into the multilayer memory film until a top surface of the multilayer memory film is about even with a top surface of the IMD layer. See, for example, FIG. 22.

At 2412, the interconnect structure is completed around the memory cell. See, for example, FIG. 23.

At 2414, a forming voltage is applied across the memory cell to form a metal filament in the switching layer, where the barrier layer slows migration of metal cations from the active metal layer to the switching layer while forming the metal filament. See, for example, FIG. 23.

While the block diagram 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated chip including: a substrate; and a RRAM cell overlying the substrate, wherein the RRAM cell includes a bottom electrode and a top electrode, and further includes a switching layer, a barrier layer, and an active metal layer stacked between the bottom and top electrodes, wherein the barrier layer is conductive and between the switching and active metal layers, and wherein the barrier layer has a lattice constant less than that of the active metal layer. In some embodiments, the active metal layer includes aluminum, and wherein the barrier layer includes tantalum. In some embodiments, the barrier layer has a greater density than the active metal layer. In some embodiments, the active metal layer includes a majority element, wherein the integrated chip includes a conductive filament in the switching layer, and wherein the conductive filament consists essentially of the majority element. In some embodiments, the conductive filament extends upward from the bottom electrode and terminates at a location spaced below the barrier layer. In some embodiments, the barrier layer and the active metal layer respectively have a barrier width and an active metal width, wherein the barrier width is greater than the active metal width. In some embodiments, the integrated chip further includes: a wire; and a via dielectric layer overlying the wire, wherein the barrier layer overlies a top surface of the via dielectric layer and has an indent at the wire, wherein the indent extends to a location below the top surface of the via dielectric layer. In some embodiments, the bottom and top electrodes and the barrier layer each have a U-shaped profile.

In some embodiments, the present application provides an integrated chip including: a bottom electrode; a dielectric layer overlying the bottom electrode; a barrier layer overlying the dielectric layer, wherein the barrier layer includes tantalum; an aluminum layer overlying the barrier layer; and a top electrode overlying the aluminum layer; wherein the bottom and top electrodes, the dielectric layer, the barrier layer, and the aluminum layer define a memory cell. In some embodiments, the barrier layer consists essentially of tantalum. In some embodiments, the integrated chip further includes an aluminum filament in the dielectric layer, wherein the aluminum filament extends upward from the bottom electrode to the barrier layer. In some embodiments, the barrier layer includes: a tantalum layer; and a tantalum nitride layer overlying the tantalum layer. In some embodiments, the integrated chip further includes: a wire underlying the bottom electrode; and a via dielectric layer between the wire and the memory cell, wherein the bottom electrode has a T-shaped profile overlying the via dielectric layer and protruding through the via dielectric layer to the wire. In some embodiments, the bottom electrode includes: a conductive body; and a conductive liner cupping an underside of the conductive body, wherein a top surface of the conductive liner is recessed relative to a top surface of the via dielectric layer.

In some embodiments, the present application provides a method including: depositing a bottom electrode layer over and electrically coupled to a conductive wire; depositing a dielectric layer over the bottom electrode layer; depositing a conductive barrier layer over the dielectric layer; depositing a metal layer over the conductive barrier layer, wherein the metal layer has a smaller density than the conductive barrier layer; depositing a top electrode layer over the metal layer, wherein the top electrode layer has low reactivity with oxygen relative to the metal layer; and patterning the bottom and top electrode layers, the dielectric layer, the conductive barrier layer, and the metal layer to form a memory cell. In some embodiments, the method further includes applying a forming voltage across the memory cell, wherein the applying results in a migration of metal cations through the conductive barrier layer, from the metal layer to the dielectric layer, and wherein the conductive barrier layer slows a rate at which the metal cations migrate through the conductive barrier layer while the forming voltage is applied. In some embodiments, the patterning includes: forming a mask over the top electrode layer; and performing an etch into the top electrode layer and the metal layer with the mask in place. In some embodiments, the etch stops on the conductive barrier layer, and wherein the patterning further includes: forming a sidewall spacer structure on sidewalls of the mask; and performing a second etch into the conductive barrier layer, the dielectric layer, and the bottom electrode layer with the mask and the sidewall spacer structure in place. In some embodiments, the method further includes: depositing a second dielectric layer covering the conductive wire; and patterning the second dielectric layer to form an opening overlying and exposing the conductive wire, wherein the bottom and top electrode layers, the dielectric layer, the conductive barrier layer, and the metal layer are deposited covering the second dielectric layer and lining the opening, and wherein the patterning of the bottom and top electrode layers, the dielectric layer, the conductive barrier layer, and the metal layer includes a planarization into the bottom and top electrode layers and the conductive barrier layer. In some embodiments, the method further includes: depositing a second dielectric layer covering the conductive wire; patterning the second dielectric layer to form an opening overlying and exposing the conductive wire; depositing a second bottom electrode layer covering the second dielectric layer and filling the opening; and performing a planarization into the second bottom electrode layer, wherein the bottom electrode layer is deposited over the second bottom electrode layer and the second dielectric layer after the planarization.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
a substrate; and
a resistive random-access memory (RRAM) cell overlying the substrate,
wherein the RRAM cell comprises a bottom electrode and a top electrode, and further comprises a switching layer, a barrier layer, and an active metal layer stacked between the bottom electrode and the top electrode,
the active metal layer comprises a first metal element,
the barrier layer comprises a second metal element and nitrogen, and a concentration of nitrogen in the barrier layer is different at a top of the barrier layer than at a bottom of the barrier layer.

2. The integrated chip according to claim 1, wherein the switching layer comprises a conductive filament embedded in dielectric material, wherein the first metal element is a majority element in the active metal layer, and wherein the conductive filament consists essentially of the first metal element.

3. The integrated chip according to claim 1, wherein the RRAM cell is configured to form a conductive filament in the switching layer from ions of the first metal element and to source the ions from the active metal layer during formation of the conductive filament.

4. The integrated chip according to claim 1, wherein the switching layer is between and directly contacts the bottom electrode and the barrier layer.

5. The integrated chip according to claim 4, wherein the active metal layer is between and directly contacts the top electrode and the barrier layer.

6. The integrated chip according to claim 1, wherein the barrier layer consists essentially of the second metal element at one of the top and the bottom of the barrier layer, and wherein the barrier layer comprises a metal nitride at another one of the top and the bottom of the barrier layer.

7. The integrated chip according to claim 1, wherein the bottom electrode and the top electrode comprise a metal nitride, wherein the active metal layer consists essentially of the first metal element, and wherein the switching layer comprises a dielectric.

8. The integrated chip according to claim 1, wherein the barrier layer comprises multiple different layers stacked away from the substrate, and wherein the multiple different layers share the second metal element and have different concentrations of nitrogen.

9. The integrated chip according to claim 8, wherein the barrier layer has only two different dielectric layers, which are respectively a metal layer and a metal nitride layer.

10. The integrated chip according to claim 1, wherein the barrier layer is on sidewalls of the active metal layer and sidewalls of the switching layer.

11. An integrated chip comprising:
a bottom electrode;
a dielectric layer overlying the bottom electrode;
a conductive filament in the dielectric layer, wherein the conductive filament extends upward from the bottom electrode;
a barrier layer overlying the dielectric layer;
an active metal layer overlying the barrier layer; and
a top electrode overlying the active metal layer;
wherein the bottom electrode, the top electrode, the dielectric layer, the barrier layer, and the active metal layer define a memory cell, and wherein the conductive filament is spaced from the barrier layer.

12. The memory cell according to claim 11, wherein the bottom electrode directly contacts the dielectric layer and comprises a metal nitride.

13. The memory cell according to claim 11, wherein the barrier layer has a greater density than the active metal layer and a lattice constant less than a lattice constant of the active metal layer.

14. The memory cell according to claim 11, wherein the active metal layer depends on less energy than the bottom electrode to oxidize.

15. An integrated chip comprising:
a wire; and
a via dielectric layer over the wire;

a bottom electrode overlying the via dielectric layer and extending through the via dielectric layer to the wire;

a switching layer overlying the bottom electrode;

a barrier layer overlying the switching layer;

an active metal layer overlying the barrier layer; and a top electrode overlying the active metal layer;

wherein the bottom electrode, the top electrode, the switching layer, the barrier layer, and the active metal layer define a memory cell, wherein the switching layer extends from the bottom electrode to the barrier layer, and wherein the bottom electrode is a metal or a metal nitride.

16. The integrated chip according to claim 15, wherein the bottom electrode has a T-shaped profile protruding through the via dielectric layer to the wire.

17. The integrated chip according to claim 15, wherein the barrier layer overlies a top surface of the via dielectric layer and has an indent overlying the wire, and wherein the indent extends to a location below the top surface of the via dielectric layer.

18. The integrated chip according to claim 15, wherein the bottom electrode comprises a conductive body and a conductive liner cupping an underside of the conductive body, and wherein a top surface of the conductive liner is recessed relative to a top surface of the via dielectric layer.

19. The integrated chip according to claim 15, further comprising a conductive filament in the switching layer, wherein a width of the conductive filament decreases away from the bottom electrode.

20. The integrated chip according to claim 15, wherein the barrier layer is on sidewalls of the active metal layer and sidewalls of the switching layer.

\* \* \* \* \*